(12) United States Patent
Nakanishi et al.

(10) Patent No.: US 8,823,564 B2
(45) Date of Patent: *Sep. 2, 2014

(54) SAMPLING CIRCUIT, A/D CONVERTER, D/A CONVERTER, AND CODEC

(71) Applicant: Asahi Kasei Microdevices Corporation, Tokyo (JP)

(72) Inventors: Junya Nakanishi, Tokyo (JP); Yutaka Nakanishi, Tokyo (JP)

(73) Assignee: Asahi Kasei Microdevices Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/882,251

(22) PCT Filed: Dec. 27, 2012

(86) PCT No.: PCT/JP2012/008402
§ 371 (c)(1),
(2), (4) Date: Apr. 29, 2013

(87) PCT Pub. No.: WO2013/132567
PCT Pub. Date: Sep. 12, 2013

(65) Prior Publication Data
US 2014/0062741 A1  Mar. 6, 2014

(30) Foreign Application Priority Data

Mar. 7, 2012  (JP) .................. 2012-050963
May 14, 2012  (JP) .................. 2012-110609
Jun. 8, 2012  (JP) .................. 2012-131034

(51) Int. Cl.
*H03M 1/00* (2006.01)
*G11C 27/02* (2006.01)
*H03M 1/08* (2006.01)
*H03M 1/12* (2006.01)
*H03M 1/66* (2006.01)

(52) U.S. Cl.
CPC .............. *G11C 27/024* (2013.01); *H03M 1/12* (2013.01); *G11C 27/02* (2013.01); *H03M 1/0827* (2013.01); *H03M 1/66* (2013.01)
USPC ............. 341/122; 341/155; 341/120; 327/12; 327/9; 327/43; 327/91; 327/94; 327/95; 327/96; 327/97; 327/291

(58) Field of Classification Search
CPC ... H03M 1/00; H03M 1/1245; H03M 1/1215; H03M 1/0658; H03M 1/128; H03M 1/0818; H03M 1/1061; H03M 1/164; H03M 1/162; H03M 1/1004; H03M 1/44; H03M 1/40; H03M 3/336; H03M 3/47; H03D 13/003; H04N 5/378; H04N 5/3575; G11C 27/024; G11C 27/026; H03K 5/1515; H03K 5/249; H03F 3/005
USPC ........ 341/111–155; 327/12, 43, 9, 91, 94, 95, 327/96, 97, 291, 337
See application file for complete search history.

(56) References Cited

U.S. PATENT DOCUMENTS

| | | | |
|---|---|---|---|
| 3,982,241 A * | 9/1976 | Lipcon ......................... | 341/118 |
| 5,548,748 A | 8/1996 | Fuse | |
| 5,698,999 A | 12/1997 | Etoh et al. | |
| 6,570,410 B2 * | 5/2003 | Manganaro ..................... | 327/94 |
| 6,937,174 B2 * | 8/2005 | Higashi et al. ................ | 341/122 |
| 6,992,509 B2 * | 1/2006 | Ko et al. ....................... | 341/122 |
| 7,113,117 B1 | 9/2006 | Pentakota et al. | |
| 7,209,061 B2 * | 4/2007 | Somayajula ................... | 341/122 |
| 7,424,275 B2 * | 9/2008 | Somayajula ................... | 341/122 |
| 7,671,769 B2 * | 3/2010 | Cesura et al. ................. | 341/121 |
| 8,004,435 B2 | 8/2011 | Waki et al. | |
| 2002/0190773 A1 * | 12/2002 | Manganaro ..................... | 327/291 |
| 2006/0055436 A1 | 3/2006 | Gaboriau et al. | |
| 2009/0219058 A1 * | 9/2009 | Ohba ............................. | 327/94 |
| 2012/0176261 A1 | 7/2012 | Ishioka et al. | |

FOREIGN PATENT DOCUMENTS

| JP | 62-006536 | 1/1987 |
|---|---|---|
| JP | 03-075976 | 3/1991 |
| JP | 8-273388 | 10/1996 |
| JP | 2001-006384 | 1/2001 |

| | | |
|---|---|---|
| JP | 2006081165 A | 3/2006 |
| JP | 2006-092483 A | 4/2006 |
| JP | 2009-124447 | 6/2009 |
| JP | 2009-130579 | 6/2009 |
| JP | 2010-193089 | 9/2010 |
| JP | 2010-226356 A | 10/2010 |
| JP | 2011-040941 A | 2/2011 |
| JP | 2012-147079 | 8/2012 |
| JP | 2012-147153 | 8/2012 |

OTHER PUBLICATIONS

International Search Report dated Feb. 5, 2013, for the corresponding international application No. PCT/JP2012/008402.
Japanese Office Action dated Oct. 29, 2013, for the corresponding Japanese Patent Application No. 2013-511202.
Written Opinion of the International Searching Authority dated Aug. 1, 2013, for the corresponding international application No. PCT/JP2012/008402.
Written Opinion of the International Searching Authority dated Jun. 21, 2013, for the related international application No. PCT/JP2012/008400.
English Translation of the International Search report for related International Application PCT/JP2012/008400, mailed Feb. 5, 2013.
Japanese Office Action dated Feb. 18, 2014.
Office Action dated Aug. 13, 2013 for related Japanese Patent Application No. 2013-511201.
JPO: Office Action for Japanese Patent Application No. JP 2013-511202—Issued on May 13, 2014—Including English Machine Translation.

* cited by examiner

*Primary Examiner* — Lam T Mai
(74) *Attorney, Agent, or Firm* — Morgan, Lewis & Bockius LLP

(57) ABSTRACT

A sampling circuit includes a continuous section which is a circuit for transmitting a continuous signal; a digital section for transmitting a signal which is sampled and quantized; and a sampling and holding section for transmitting a signal which is sampled but not quantized between the continuous section and the digital section. The sampling and holding section includes capacitors for accumulating charge generated by an input signal and plural switches for accumulating the charge in the capacitors. The plural switches receive plural clock signals having different operation timings and perform an ON/OFF operation in response to the supplied clock signals.

9 Claims, 29 Drawing Sheets

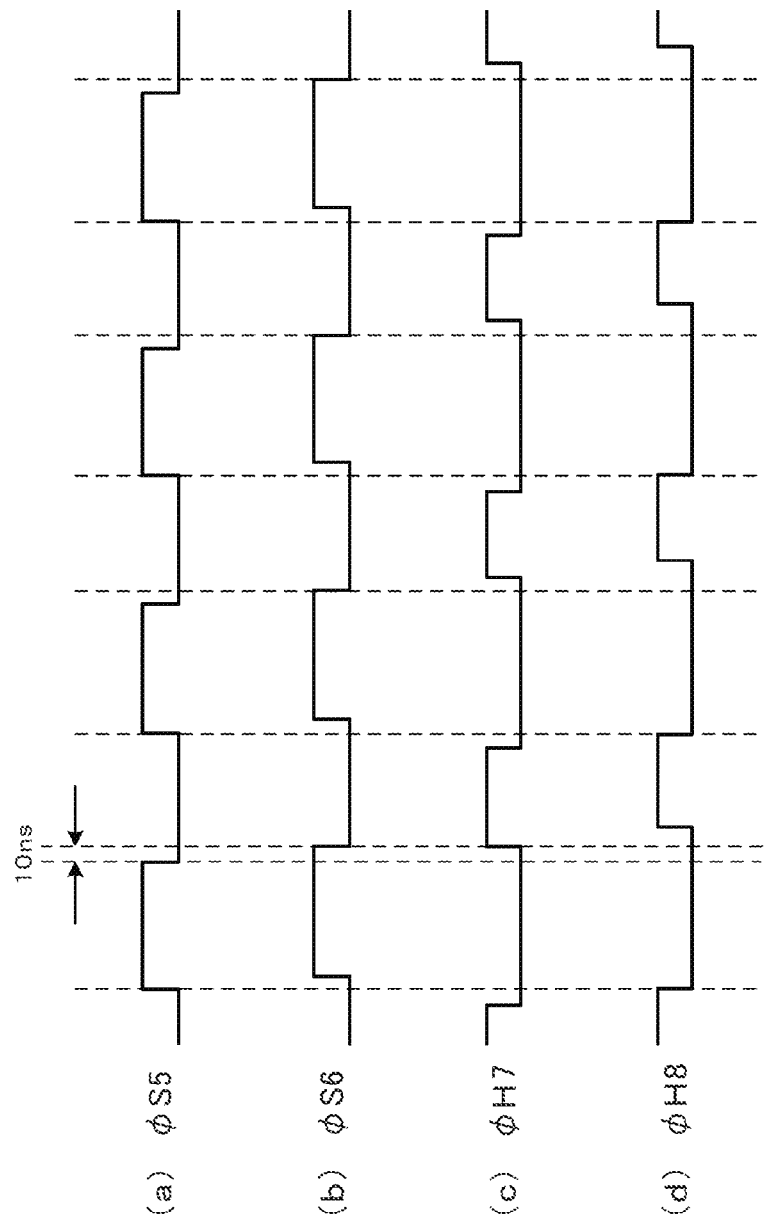
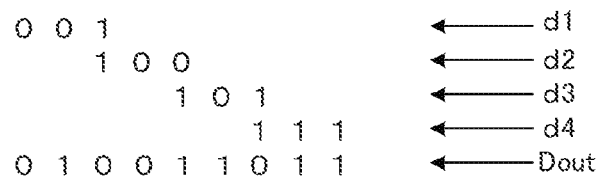
FIG. 26

SAMPLING CIRCUIT, A/D CONVERTER, D/A CONVERTER, AND CODEC

TECHNICAL FIELD

The present invention relates to a sampling circuit, and an A/D converter, a D/A converter, and a CODEC, each including the sampling circuit.

BACKGROUND ART

At the present time, a decrease in the size of electronic devices are demanded more and more, the sizes of electronic components mounted on the electronic devices are decreased, so that the electronic components are arranged closer to each other. When such electronic components are arranged close to each other, noise generated in an electronic component may be transmitted to other electronic components directly or through a mounting board or wires and may hinder normal operations of the other electronic components. Accordingly, suppression of an influence of noise along with a decrease in size are requested for electronic devices these years (hereinafter, referred to as anti-noise measures).

In order to prevent noise generated in an electronic component from influencing on other electronic components, it is generally conceivable that electronic components are arranged so as to be separated from each other to such an extent to reduce the influence of noise or arrangement or separation of elements is designed in processes of manufacturing the electronic components. It is also conceivable that input and output terminals are independently provided for individual electronic components.

However, the arrangement of the electronic components to be separated from each other hinders a decrease in the size of the electronic devices, which is not preferable. In order to prevent noise from influencing on the outside through the use of processes of manufacturing the electronic components, advanced process technology is needed and the manufacturing cost is increased as a result, which is not preferable. Division of the input terminal or the output terminal increases the number of pins of the electronic devices and is disadvantageous for decreasing the size of the electronic components.

Examples of the electronic components mounted on the electronic devices include a D/A converter and an A/D converter. The D/A converter and the A/D converter are electronic components widely used for audio functions of the electronic devices and are electronic components particularly necessitating the anti-noise measures.

As a technique for the anti-noise measures of the D/A converter and the A/D converter, for example, the invention described in Patent Document 1 is known. In the invention described in Patent Document 1, jitter is added to a synchronization signal (control clock signal) of an input signal of the D/A converter or the A/D converter. According to the invention described in Patent Document 1, it is possible to spread radiation of beat noise due to a synchronization signal (conversion clock signal) used to output an output signal and the control clock signal.

Such conventional techniques were invented on the basis of a thought that radiation noise generated from the A/D converter or the D/A converter is reduced to reduce an influence of noise on other equipment.

PRIOR ART DOCUMENT

Patent Document

Patent Document 1: JP S62-6536 A

SUMMARY OF THE INVENTION

Problem to be Solved

However, even when radiation noise generated from the D/A converter or the A/D converter is reduced as described in the conventional techniques, the influence of the generated noise on the other cannot be satisfactorily reduced.

In the conventional techniques, since the jitter is added to a digital section only, periodic noise due to inrush current in an analog section cannot be spread. Accordingly, the spread effect of the conventional techniques is restrictive.

In order to reduce the direct or indirect influence of radiation noise generated from individual electronic components on the D/A converter and the A/D converter using the conventional technique, a circuit for inputting a jitter should be provided to other components mounted on an electronic apparatus. In this configuration, it is necessary to provide plural circuits for inputting the jitter, which hinders a decrease in the size of the electronic apparatus.

The present invention has been made in consideration of the above-mentioned circumstances, and an object thereof is to provide a sampling circuit which does not hinder a decrease in the size of electronic components and which can reduce an influence of noise on the electronic components mounted on an electronic device while avoiding advancement in process technology, an A/D converter, and a D/A converter each including the sampling circuit, and a CODEC in which the A/D converter and the D/A converter are combined.

Solution to the Problem

According to an aspect of the present invention, there is provided a sampling circuit (for example, a sampling circuit 801 shown in FIG. 31) including: a continuous section (for example, a continuous section 130*a* shown in FIG. 31) that is a circuit transmitting a continuous signal; a sampling and holding section (for example, a sampling and holding section 130*b* shown in FIG. 31) that is connected to the continuous section and that is a circuit transmitting a signal which is sampled but not quantized; and a digital section (for example, a digital section 130*c* shown in FIG. 31) that is connected to the sampling and holding section and that is a circuit transmitting a signal which is sampled and quantized, wherein the sampling and holding section includes a plurality of capacitive elements (for example, capacitors 111_1 and 111_2 shown in FIG. 30) for accumulating charge generated by an input signal and a plurality of first switching elements (for example, switches 103_1 and 103_2 shown in FIG. 30) that correspond to the plurality of capacitive elements, respectively, and wherein a plurality of first clock signals (for example, clock signals φH9 and φH10 shown in FIG. 30) supplied to the plurality of first switching elements are signals having different operation timings, and the first switching elements perform an ON/OFF operation in response to the first clock signals, respectively.

The first switching elements (for example, switches 103_1 and 103_2 shown in FIG. 30) may hold the charge respectively accumulated in the plurality of capacitive elements (for example, capacitors 111_1 and 111_2 shown in FIG. 30).

The continuous section (for example, a continuous section 130*a* shown in FIG. 30) may include a plurality of second switching elements (for example, switches 101_1, 101_2, 102_1, and 102_2 shown in FIG. 30) for accumulating charge in the plurality of capacitive elements (for example, capacitors 111_1 and 111_2 shown in FIG. 30), respectively, wherein a plurality of second clock signals (for example, clock signals φS7 and φS8 shown in FIG. 30) supplied to the plurality of second switching elements may be signals having edges that are triggers for determining operation start times and are different from each other, and edges that are triggers for determining operation end times are identical to each other, and the first clock signals and the second clock signals have a reverse-phased and non-overlapping relationship, and the second switching elements may perform an ON/OFF operation in response to the second clock signals, respectively.

The first switching elements (for example, switches 101_1, 101_2, 102_1, and 102_2 shown in FIG. 21) may accumulate charge in the plurality of capacitive elements, respectively (for example, capacitors 111_1 and 111_2 shown in FIG. 21).

The continuous section (for example, a continuous section 150a shown in FIG. 21) may include a plurality of second switching elements (for example, switches 103_1, 103_2, 104_1, and 104_2 shown in FIG. 21) for transmitting the charge respectively accumulated in the plurality of capacitive elements (for example, capacitors 111_1 and 111_2 shown in FIG. 21), wherein a plurality of second clock signals (for example, clock signals φH5 and φH6 shown in FIG. 21) supplied to the plurality of second switching elements may be signals in which triggers for determining operation start times are generated at the same timing and triggers for determining operation end times are generated at different timings, the first clock signals and the second clock signals may have a reverse-phased and non-overlapping relationship, and the second switching elements may perform an ON/OFF operation in response to the second clock signals, respectively.

According to another aspect of the present invention, there is provided an A/D converter including: a sampling circuit (for example, a sampling circuit 801 shown in FIG. 31) including a continuous section (for example, a continuous section 130a shown in FIG. 31) for sampling an input analog signal, a sampling and holding section (for example, a sampling and holding section 130b shown in FIG. 31) for holding the signal sampled by the continuous section, and a digital section (for example, a digital section 130c shown in FIG. 31) for outputting the signal from the sampling and holding section as a digital signal; and a clock signal supply unit (for example, a control circuit 139 shown in FIG. 31), wherein the sampling and holding section includes a plurality of capacitive elements (for example, capacitors 111_1 and 111_2 shown in FIG. 30) for accumulating charge generated by the analog signal and a plurality of first switching elements (for example, switches 103_1 and 103_2 shown in FIG. 30) for holding and transmitting the charge respectively accumulated in the plurality of capacitive elements to the digital section, wherein the clock signal supply unit supplies a plurality of first clock signals (for example, clock signals φH9 and φH10 shown in FIG. 30) having different operation timings to the plurality of first switching elements, and wherein the plurality of first switching elements perform an ON/OFF operation in response to the supplied first clock signals, respectively.

The continuous section (for example, a continuous section 130a shown in FIG. 30) may include a plurality of second switching elements (for example, switches 101_1, 101_2, 102_1, and 102_2 shown in FIG. 30) that transmit the charge respectively accumulated in the plurality of capacitive elements (for example, capacitors 111_1 and 111_2 shown in FIG. 30), the clock signal supply unit (for example, a control circuit 139 shown in FIG. 30) may supply a plurality of second clock signals (for example, clock signals φS7 and φS8 shown in FIG. 30) having edges that are triggers for determining operation start times are different from each other, and edges that are triggers for determining operation end times are identical to each other, to the plurality of second switching elements, the plurality of second switching elements may perform an ON/OFF operation in response to the second clock signals, respectively, and the first clock signals and the second clock signals may have a reverse-phased and non-overlapping relationship.

According to still another aspect of the invention, there is provided a D/A converter including: a sampling circuit (for example, a sampling circuit 150 shown in FIG. 23) including a digital section (for example, a digital section 150c shown in FIG. 23) for outputting a digital signal, a sampling and holding section (for example, a sampling and holding section 150b shown in FIG. 23) for sampling a reference signal based on the digital signal, and a continuous section (for example, a continuous section 150a shown in FIG. 23) for transmitting the signal sampled by the sampling and holding section as an analog signal; and a clock signal supply unit (for example, a control circuit 159 shown in FIG. 23), wherein the sampling and holding section includes a plurality of capacitive elements (for example, capacitors 111_1 and 111_2 shown in FIG. 21) for accumulating charge generated by the reference signal and a plurality of first switching elements (for example, switches 101_1, 101_2, 102_1, and 102_2 shown in FIG. 21) for accumulating the charge in the plurality of capacitive elements, wherein the clock signal supply unit supplies a plurality of first clock signals (for example, clock signals φS3 and φS4 shown in FIG. 21) having different operation timings to the plurality of first switching elements, and wherein the plurality of first switching elements perform an ON/OFF operation in response to the supplied first clock signals, respectively.

The continuous section (for example, a continuous section 150a shown in FIG. 21) may include a plurality of second switching elements (for example, switches 103_1, 103_2, 104_1, and 104_2 shown in FIG. 21) for transmitting the charge accumulated in the plurality of capacitive elements (for example, capacitors 111_1 and 111_2 shown in FIG. 21), wherein the clock signal supply unit may supply second clock signals (for example, clock signals φH5 and φH6 shown in FIG. 21) having triggers for determining operation start times generated at the same timing, and triggers for determining operation end times are generated at different timings, to the plurality of second switching elements, wherein the plurality of second switching elements may perform an ON/OFF operation in response to the supplied second clock signals, respectively, and wherein the first clock signals and the second clock signals may have a reverse-phased and non-overlapping relationship.

According to still another aspect of the present invention, there is provided a CODEC including the A/D converter (for example, an A/D converter ADC shown in FIG. 32) according to any one of the above-mentioned aspects and the D/A converter (for example, a D/A converter DAC shown in FIG. 32) according to any one of the above-mentioned aspects which are combined therein.

The A/D converter and the D/A converter may operate asynchronously.

Advantageous Effects of the Invention

According to the aspects of the present invention, it is possible to provide a sampling circuit which can reduce an influence of noise on electronic components mounted on an electronic device, an A/D converter and a D/A converter including the sampling circuit, and a CODEC in which the A/D converter and the D/A converter are combined. Since this advantage is achieved by causing the continuous section to operate in response to the first clock signal working at a single operation timing and causing the sampling and holding section to operate on the basis of the second clock signal group having two or more different operation timings, the decrease in the size of the electronic components is not hindered. It is also not necessary to advance the process technology.

Since radiation noise due to inrush current in the analog section can be spread, it is possible to effectively suppress the radiation noise.

BRIEF DESCRIPTION OF THE DRAWINGS

FIGS. 25(a)-(d) are diagrams illustrating clock signals in Embodiment 2 of the present invention;

FIG. 26 is a diagram illustrating a calculation of calculating a digital output signal $D_{out}$ in Embodiment 2 of the present invention;

DESCRIPTION OF EMBODIMENTS

Hereinafter, the invention will be described.

First, a concept of a sampling circuit and a D/A converter using the sampling circuit according to the present invention will be described before describing embodiments of the present invention.

A sampling circuit described herein (hereinafter, referred to as "first aspect") is a sampling circuit serving as a basis of Embodiment 1 to be described later.

Figure 1:
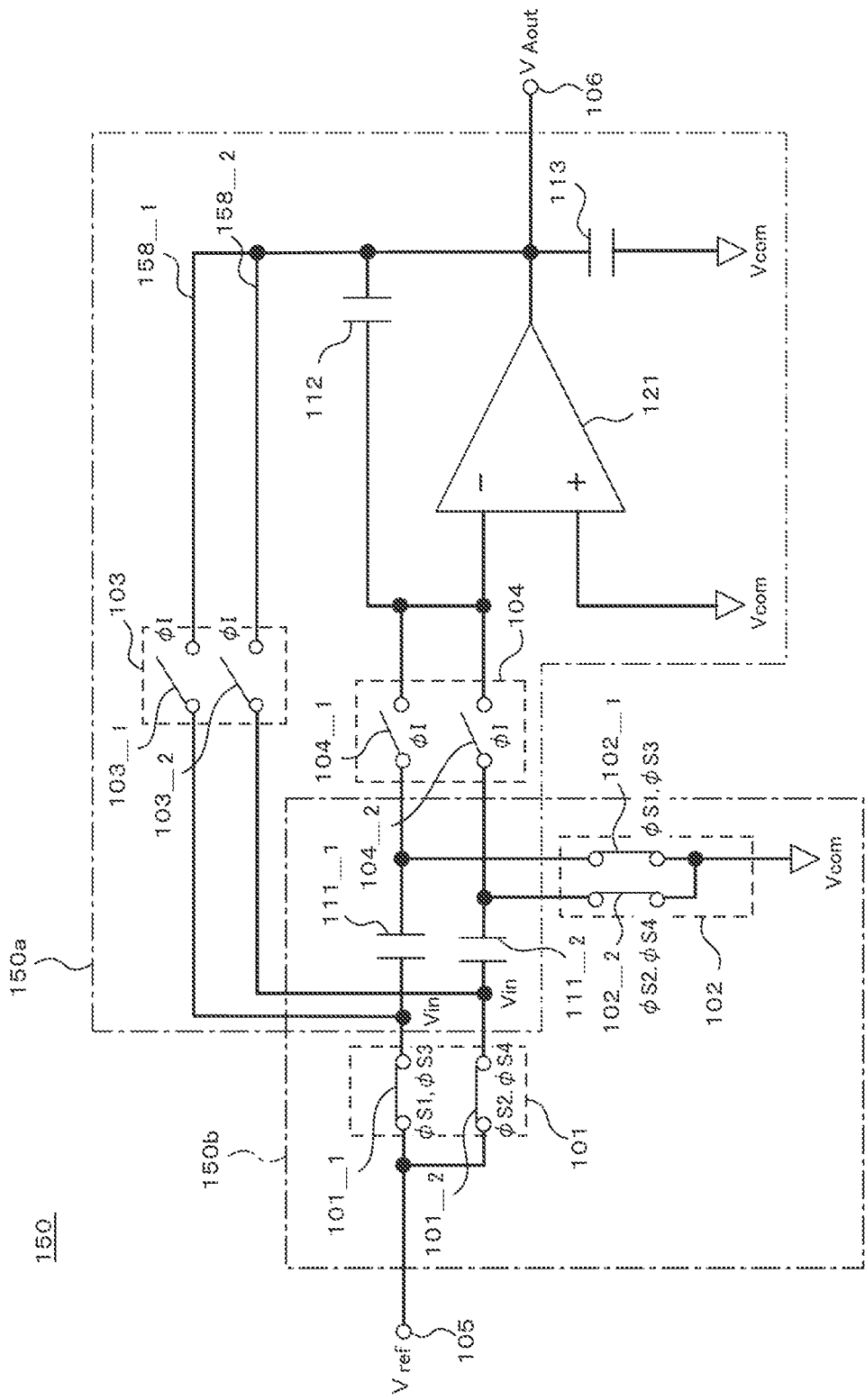
FIG. 1 is a diagram illustrating a sampling circuit according to a first aspect of the present invention.

FIG. 1 is a diagram illustrating a sampling circuit according to a first aspect.

The sampling circuit 150 shown in FIG. 1 includes a digital section, a sampling and holding section, and a continuous section. The digital section is constructed by a general digital circuit and is configured to transmit a signal which is quantized and sampled. The sampling and holding section is constructed by a general switched capacitor circuit (SC circuit) and is configured to transmit a signal which is not quantized and sampled. The continuous section is constructed by a general continuous signal circuit (continuous circuit) and is configured to transmit a signal which is not quantized and not sampled.

In FIG. 1, the digital section handling a digital signal out of the above-mentioned configuration is not shown, but a continuous section 150a and a sampling and holding section 150b are shown. The digital section is disposed in the front stage of the sampling and holding section 150b shown in FIG. 1.

The sampling and holding section 150b includes switches 101_1, 101_2, 102_1, and 102_2 and capacitors 111_1 and 111_2. The switch 101_1, the capacitor 111_1, and the switch 102_1 are connected in series to each other. Similarly, the switch 101_2, the capacitor 111_2, and the switch 102_2 are connected in series to each other. The switches 101_1 and 101_2 constitute a switch unit 101, and the switches 102_1 and 102_2 constitute a switch unit 102.

The continuous section 150a includes a switch 104_1 connected in series to the capacitor 111_1, a switch 104_2 connected in series to the capacitor 111_2, and an operational amplifier 121 of which the inverting input terminal is connected to ends of the switches 104_1 and 104_2. The continuous section 150a further includes a switch 103_1 connected to the output terminal of the operational amplifier 121 and a node between the switch 101_1 and the capacitor 111_1, a switch 103_2 connected to the output terminal of the operational amplifier 121 and a node between the switch 101_2 and the capacitor 111_2, and a capacitor 112 connected to a node between the output terminal of the operational amplifier 121 and the inverting input terminal. The switches 103_1 and 103_2 constitute a switch unit 103, and the switches 104_1 and 104_2 constitute a switch unit 104.

An LPF (Low-Pass Filter) is formed in the continuous section 150a by the capacitor 112, and the cutoff frequency of the LPF is determined by the capacity ratio of the capacitor 112 and the capacitors 111_1 and 111_2 and the switching frequency. The capacitor 112 is not an essential element to the sampling circuit according to the first aspect.

The sampling circuit 150 further includes a capacitor 113. The capacitor 113 accumulates charge generated by an analog output signal $V_{Aout}$ in feedback paths 158_1 and 158_2 in which the analog output signal $V_{Aout}$ of the operational amplifier 121 is input to the inverting input terminal.

The output terminal of the operational amplifier 121 is connected to a terminal 106, and an analog output signal $V_{Aout}$ is output from the terminal 106. The non-inverting input terminal and the inverting input terminal of the operational amplifier 121 are supplied with a standard signal $V_{com}$ of a common mode voltage via the switches 104_1 and 104_2.

In the sampling circuit 150 shown in FIG. 1, the sampling and holding section 150b and the continuous section 150a share the capacitors 111_1 and 111_2. That is, the capacitors 111_1 and 111_2 serve as the sampling and holding section 150b and also serve as the continuous section 150a.

A reference signal $V_{ref}$ is input to the sampling circuit 150 from the terminal 105. The reference signal $V_{ref}$ is sampled by the switches 101_1 and 102_1. Charges are accumulated in the capacitor 111_1 by this sampling. The reference signal $V_{ref}$ is sampled by the switches 101_2 and 102_2 and charge are accumulated in the capacitor 111_2. The reference signal $V_{ref}$ sampled by the switches 101_1, 101_2, 102_1, and 102_2 are referred to as an input signal $V_{in}$.

The charge accumulated in the capacitors 111_1 and 111_2 are input to the inverting input terminal of the operational amplifier 121 by switching of the switches 101_1, 102_1, 104_1, and the switches 101_2, 102_2, and 104_2. The operational amplifier 121 receives an input of the standard signal $V_{com}$ from the non-inverting input terminal and outputs an analog output signal $V_{Aout}$.

In the sampling circuit 150 shown in FIG. 1, plural (two in the example shown in FIG. 1) capacitors 111_1 and 111_2 are provided to the sampling and holding section 150b. The number of switches included in the switch units 103 and 104 of the continuous section 150a corresponds to the number of capacitors 111_1 and 111_2. The amount of charge accumulated in the capacitor 111_1 is determined by the switches 103_1 and 104_1. The amount of charge accumulated in the capacitor 111_2 is determined by the switches 103_2 and 104_2.

The number of capacitors 111_1 and 111_2 of the sampling and holding section 150b in the first aspect is not limited to two and may be a natural number M. In this case, each of the switch units 103 and 104 of the continuous section 150a include M switches.

In the sampling circuit 150 shown in FIG. 1, as the number M of capacitors 111_1 and 111_2 increases, the number of switches included in the switch units 103 and 104 increases accordingly. If the number of capacitors 111_1 and 111_2 increases, the configuration of the continuous section 150a will not change from the configuration as shown in FIG. 1, except that the number of switches included in the switch units 103 and 104 increases.

In the sampling circuit 150 shown in FIG. 1, as the number M of capacitors 111_1 and 111_2 increases, the number of switches included in the switch units 101 and 102 increases accordingly. If the number of capacitors 111_1 and 111_2 increases, the configuration of the sampling and holding section 150b will not change from the configuration as shown in FIG. 1, except that the number of switches included in the switch units 101 and 102 increases.

When capacitors are added to the continuous section 150a shown in FIG. 1, the total capacity of the capacitors after the adding is equal to the total capacity of the capacitors 111_1 and 111_2. By employing this configuration, the capacity magnitude and the operation timing of the capacitors 111_1 and 111_2 can be appropriately distributed to form an analog FIR (Finite Impulse Response) filter that lowers the gain of a specific frequency included in the output signal $V_{Aout}$.

In the first aspect, the switch 101_1 and the switch 101_2 are driven by different clock signals, and the switch 102_1 and the switch 102_2 are driven by different clock signals. The switches 103_1 and 103_2 and the switches 104_1 and 104_2 are driven by a clock signal φI different from any of the clock signals for driving the switches 101_1 and 102_2.

Here, the operation of the configuration of the first aspect will be described that the first aspect achieve an effect capable of reducing noise generated by a D/A converter using the sampling circuit 150 shown in FIG. 1 even when periodic noise (noise due to inrush current in a circuit managing an analog signal: hereinafter, simply referred to as noise) is superimposed on the input signal.

In the below description, for the purpose of easy understanding of the effect of the first aspect, a case where the switch 101_1 and the switch 101_2 of the sampling circuit 150 shown in FIG. 1 are driven by clock signals of the same timing, the switch 102_1 and the switch 102_2 are driven by clock signals of the same timing, the switch 103_1 and the switch 103_2 are driven by clock signals of the same timing, and the switch 104_1 and the switch 104_2 are driven by clock signals of the same timing (hereinafter, referred to as "driving using a general clock signal") will be first described.

The output signal $V_{Aout}$ when the sampling circuit 150 shown in FIG. 1 is driven by general clock signals will be described for two cases of a case where periodic noise is not superimposed on the reference signal $V_{ref}$ and a case where periodic noise is imposed on the reference signal.

In the sampling circuit 150 shown in FIG. 1, when periodic noise is superimposed on the reference signal $V_{ref}$ and the standard signal $V_{com}$, the periodic noise appears in an output waveform with a gain of 0 dB. Accordingly, the sensitivity of the sampling circuit 150 to noise is 0 dB which is the highest. In the first aspect, a case where periodic noise is superimposed on the reference signal $V_{ref}$ will be described, but the same consideration can be applied to a case where periodic noise is superimposed on a signal other than the reference signal $V_{ref}$. Examples of the signal other than the reference signal $V_{ref}$ on which periodic noise is superimposed include a standard signal $V_{com}$.

Figure 2:
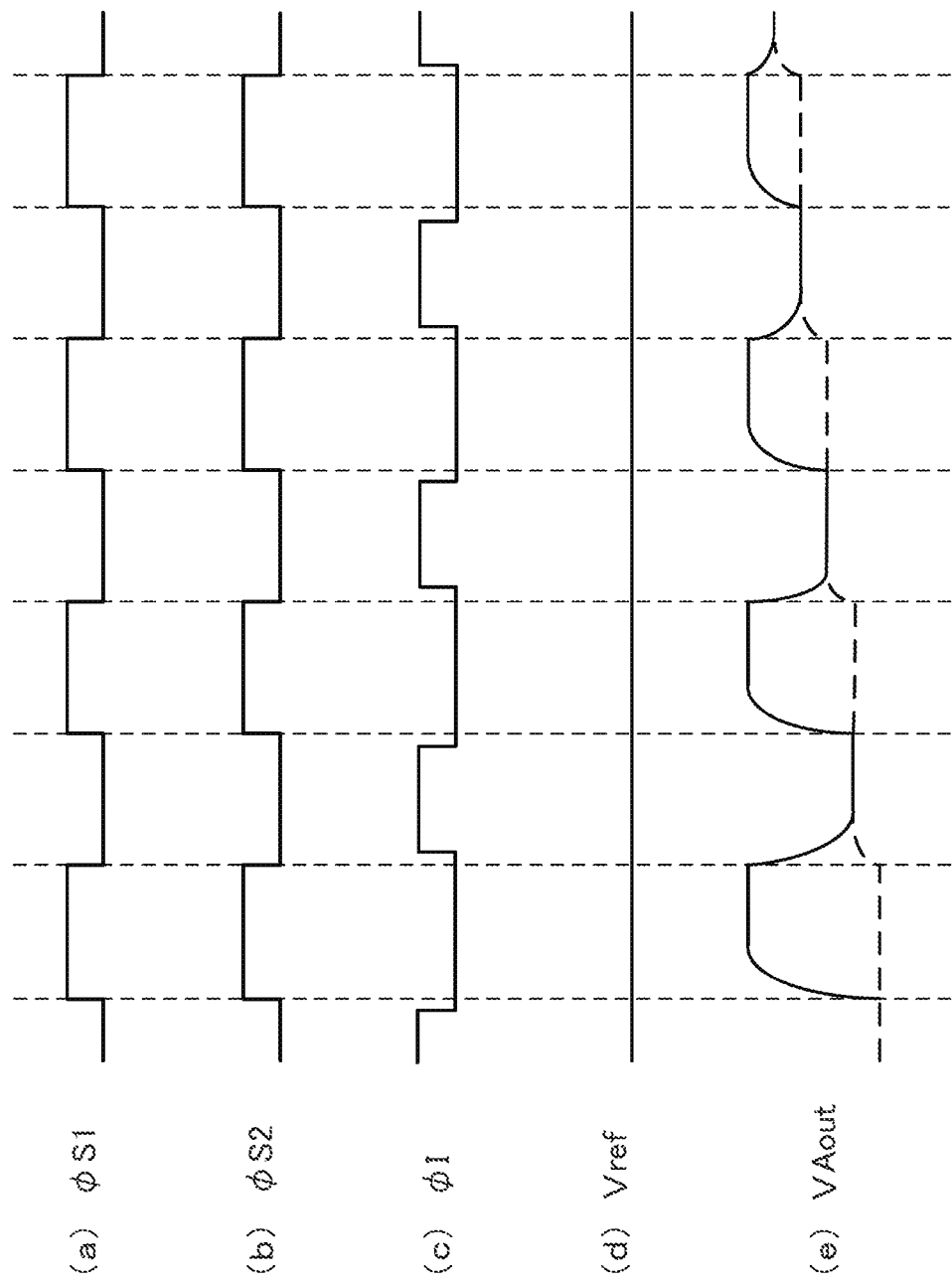
FIGS. 2(a)-(e) are diagrams illustrating an operation of the sampling circuit when periodic noise is not present in a reference signal $V_{ref}$.

(a) to (e) of FIG. 2 are diagrams illustrating the operation of the sampling circuit 150 shown in FIG. 1 when periodic noise is not present in the reference signal $V_{ref}$.

(a) of FIG. 2 shows a clock signal φS1 for driving the switch 101_1 and the switch 102_1.

The clock signal φS1 is matched with the sampling timing of the reference signal $V_{ref}$ in the capacitor 111_1.

(b) of FIG. 2 shows a clock signal φS2 for driving the switch 101_2 and the switch 102_2.

The clock signal φS2 is matched with the sampling timing of the reference signal $V_{ref}$ in the capacitor 111_2. Since the clock signal φS1 and the clock signal φS2 shown in FIG. 2 are equal to each other, the capacitor 111_1 and the capacitor 111_2 in the sampling circuit 150 shown in FIG. 1 operate at the same timing.

(c) of FIG. 2 shows a clock signal φI for driving the switches included in the switch unit 103 and 104.

The clock signal φI is matched with the timing at which the capacitors 111_1 and 111_2 hold and discharge the charge accumulated by the input signal $V_{in}$. The clock signal φI is a reverse-phased and non-overlapping clock signal which is not changed to the high level at the same time as any of the clock signals φS1 and φS2.

(d) of FIG. 2 shows the reference signal $V_{ref}$ which is a DC voltage and (e) of FIG. 2 shows the output signal $V_{Aout}$ as an analog signal which is output from the operational amplifier 121.

In (e) of FIG. 2, the signal indicated by a solid line is an input signal $V_{in}$ generated by the charge transmitted from the capacitors 111_1 and 111_2, and the output signal $V_{Aout}$ indicated by a dotted line is generated from the sampling circuit 150 by feedback.

Figure 3:
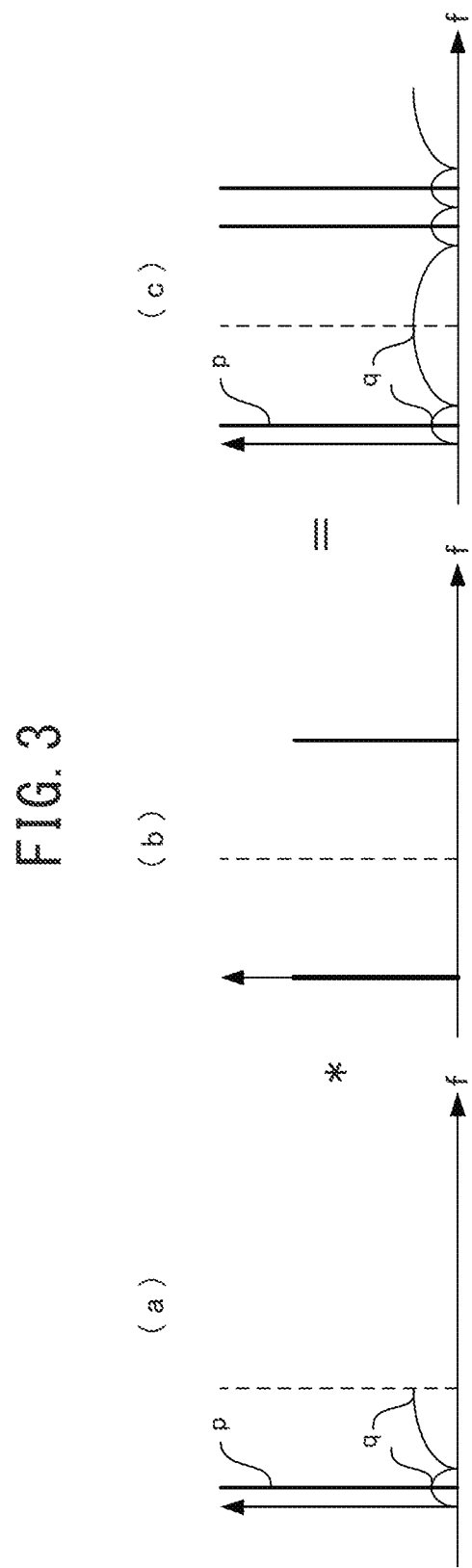
FIGS. 3(a)-(c) are diagrams illustrating a signal output from the sampling circuit.

FIG. 3 is a diagram illustrating a method of displaying the output signal $V_{Aout}$ from the input signal $V_{in}$. In FIG. 3, graph (a) of FIG. 3 shows signals output from the capacitors 111_1 and 111_2 shown in FIG. 1 and shows a spectrum obtained by transforming the input signal $V_{in}$ into a frequency axis by Fourier transform.

Graph (b) of FIG. 3 shows a spectrum obtained by transforming a clock signal for managing the timings at which the capacitors 111_1 and 111_2 hold and discharge the charge accumulated by the input signal $V_{in}$ into the frequency axis by Fourier transform.

Graph (c) of FIG. 3 shows a spectrum obtained by transforming the output signal $V_{Aout}$ into the frequency axis by Fourier transform.

In any of graphs (a), (b), and (c) of FIG. 3, the vertical axis represents the spectrum intensity of a signal and the horizontal axis represents the frequency. The position of the vertical axis indicated by an arrow line in graphs (a), (b), and (c) of FIG. 3 represents the frequency reference ("0").

As shown in FIG. 3, the signal (indicated by a spectrum p in the drawing) output from the capacitors 111_1 and 111_2 has a constant frequency. A spectrum q represents noise-shaped floor noise in the input signal $V_{in}$. When the spectrums p and q are sampled by the switches 101_1, 102_1, 101_2, and 102_2 and are held and discharged, the output signal $V_{Aout}$ shown in (c) of FIG. 3 is generated by convolution. The spectrums p and q are symmetrically mirrored in the output signal $V_{Aout}$.

A case where periodic noise is present in the reference signal $V_{ref}$ will be described below. In this case, it is assumed that the switches 101_1 and 101_2 are driven by clock signals of the same timing, the switches 102_1 and 102_2 are driven by clock signals of the same timing, the switches 103_1 and 103_2 are driven by clock signals of the same timing, and the switches 104_1 and 104_2 are driven by clock signals of the same timing.

Figure 4:
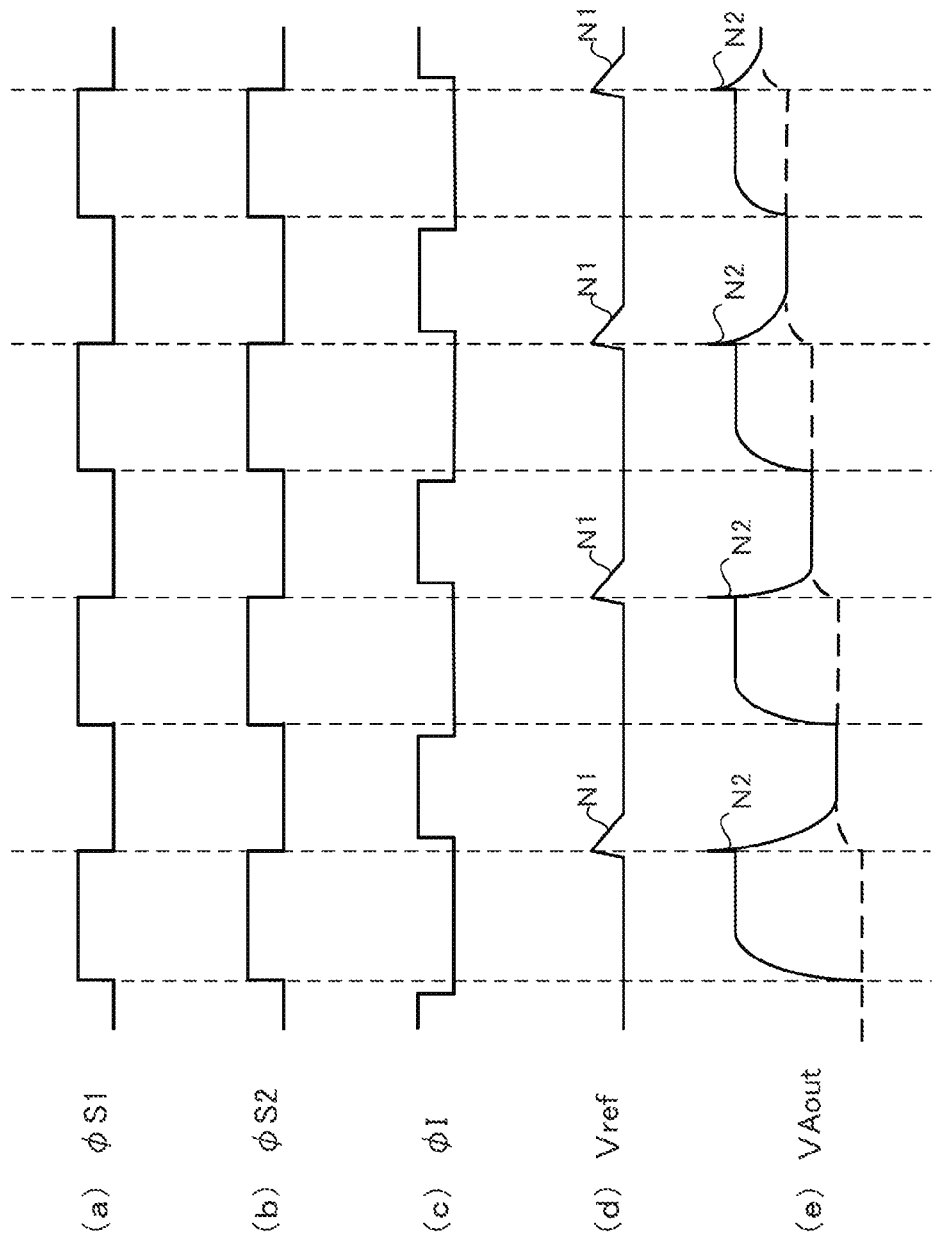
FIGS. 4(a)-(e) are diagrams illustrating an operation of the sampling circuit when periodic noise is present in a reference signal $V_{ref}$.

(a) to (e) of FIG. 4 are diagrams illustrating the operation of a D/A converter when periodic noise is present in the reference signal $V_{ref}$ in the sampling circuit 150 shown in FIG. 1.

(a) of FIG. 4 shows the sampling timing of the reference signal $V_{ref}$ in the capacitor 111_1.

(b) of FIG. 4 shows the sampling timing of the reference signal $V_{ref}$ in the capacitor 111_2.

(c) of FIG. 4 shows the timings at which the capacitors 111_1 and 111_2 hold and discharge the charge accumulated by the reference signal $V_{ref}$, (d) of FIG. 4 shows the reference signal $V_{ref}$ which is a DC voltage, and (e) of FIG. 4 shows the output signal $V_{Aout}$ as an analog signal which is output from the operational amplifier 121.

Here, (a) of FIG. 4 and (b) of FIG. 4 operate at the same timing. As can be clearly seen from (d) and (e) of the drawing, when periodic noise N1 is superimposed on the reference signal $V_{ref}$ shown in (d) of FIG. 4, periodic noise N2 corresponding to the periodic noise N1 is generated in the output signal $V_{Aout}$ in the D/A converter.

The periodic noise shown in (d) and (e) of FIG. 4 will be described below with reference to graphs (a), (b), and (c) of FIG. 5.

Figure 5:
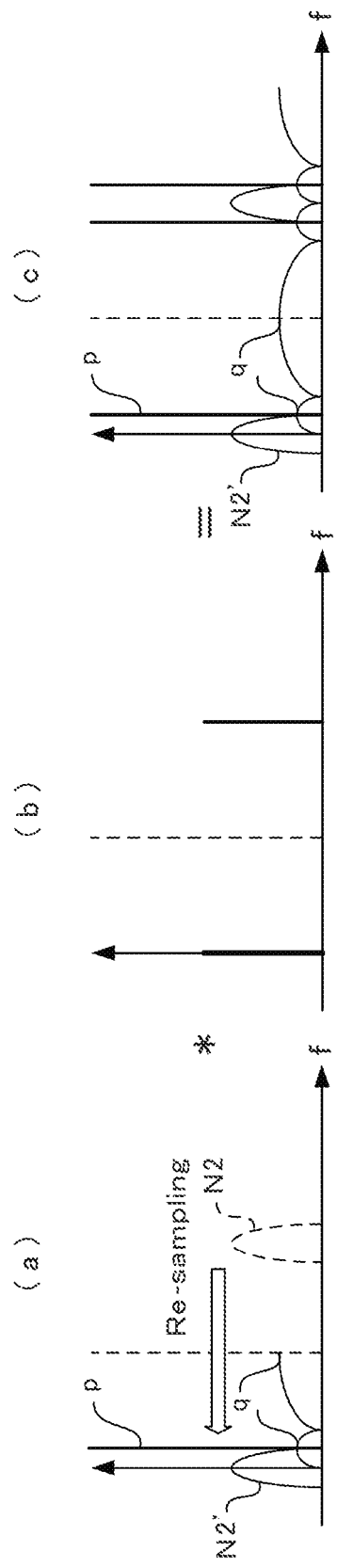
FIGS. 5(a)-(c) are diagrams illustrating periodic noise.

Graph (a) of FIG. 5 is a graph illustrating signals output from the capacitors 111_1 and 111_2 shown in FIG. 1 and shows a spectrum obtained by transforming the input signal $V_{in}$ into a frequency axis by Fourier transform.

Graph (b) of FIG. 5 shows a spectrum obtained by transforming a clock signal for managing the timings at which the capacitors 111_1 and 111_2 hold and discharge the charge accumulated by the input signal $V_{in}$ into the frequency axis by Fourier transform. Graph (c) of FIG. 5 shows a spectrum obtained by transforming the output signal $V_{Aout}$ into the frequency axis by Fourier transform.

In any of graphs (a), (b), and (c) of FIG. 5, the vertical axis represents the spectrum intensity of a signal and the horizontal axis represents the frequency. The position of the vertical axis indicated by an arrow line in graphs (a), (b), and (c) of FIG. 5 represents the frequency reference ("0").

When the spectrums shown in graph (a) of FIG. 5 are sampled by the switches 101_1, 102_1, 101_2, and 102_2 shown in FIG. 1 and are held and discharged, periodic noise N2 is replicated and appears as periodic noise N2' in the vicinity of the DC. As shown in graph (c) of FIG. 5, the periodic noise N2' is symmetrically mirrored by convolution and the output signal $V_{Aout}$ is generated. The periodic noise N2' appears in the frequency band (hereinafter, also referred to as in-band) used for an output audio, when the D/A converter is used, for example, in an audio device.

The first aspect has been made on the basis of a technical thought that periodic noise appearing in the in-band due to a signal output from another device is spread and signal quality of an output signal such as an audio is prevented from being damaged, by using plural different clock signals of causing a device such as a sampling circuit to operate.

The signals output from the capacitors 111_1 and 111_2 shown in graph (a) of FIG. 5 will be described in more detail with reference to FIG. 6.

Figure 6:
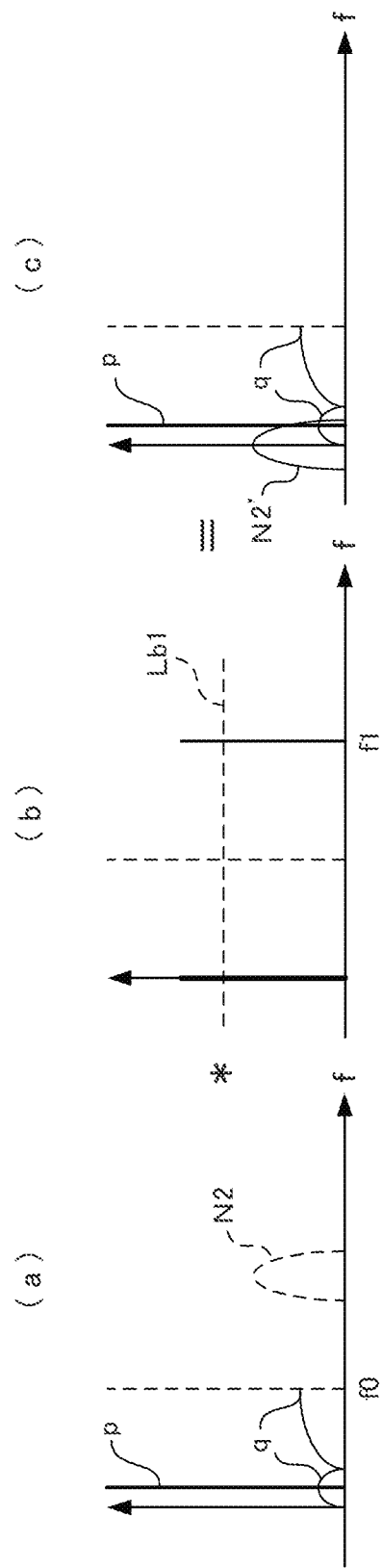
FIGS. 6(a)-(c) are diagrams illustrating a signal output from a capacitor.

Graph (a) of FIG. 6 shows frequency characteristics of the output signal $V_{Aout}$ shown in (e) of FIG. 4 and shows a spectrum obtained by transforming the reference signal $V_{ref}$ having periodic noise superimposed thereon into the frequency axis by Fourier transform.

The frequency f0 indicated by a dotted line in graph (a) of FIG. 6 represents the Nyquist frequency and is half a sampling operation frequency.

Graph (b) of FIG. 6 shows a spectrum obtained by transforming a clock signal for managing the sampling timings, at which the capacitors 111_1 and 111_2 accumulate the input signal $V_{in}$, into the frequency axis by Fourier transform.

The frequency f1 indicated by a solid line in graph (b) of FIG. 6 is a sampling operation frequency. The frequency characteristics (F characteristics) indicated by a dotted line Lb1 in graph (b) of FIG. 6 are frequency characteristics of the FIR filter obtained through the sampling operation.

Here, since the sampling operation is performed using a single clock signal, the frequency characteristics of the FIR filter provide an all-pass filter (a gain suppression effect is not exhibited for all frequencies).

Graph (c) of FIG. 6 shows a spectrum obtained by transforming the output signal $V_{Aout}$ into the frequency axis by Fourier transform.

In any of graphs (a), (b), and (c) of FIG. 6, the vertical axis represents the spectrum intensity of a signal and the horizontal axis represents the frequency. The position of the vertical axis indicated by an arrow line in graphs (a), (b), and (c) of FIG. 6 represents the frequency reference ("0").

As shown in graph (c) of FIG. 6, the filtering effect due to the FIR filter is not obtained in the sampling operations of the capacitors 111_1 and 111_2 shown in FIG. 1. Accordingly, the spectrum of the periodic noise N2 is replicated to periodic noise N2' without any change.

The first aspect has been made by paying attention to the thought that the signal quality in the in-band can be enhanced by spreading the periodic noise N2'. Accordingly, the sampling and holding section 150b of the sampling circuit 150 operates by plural clock signals. The plural clock signals in the first aspect will be described below.

Figure 7:
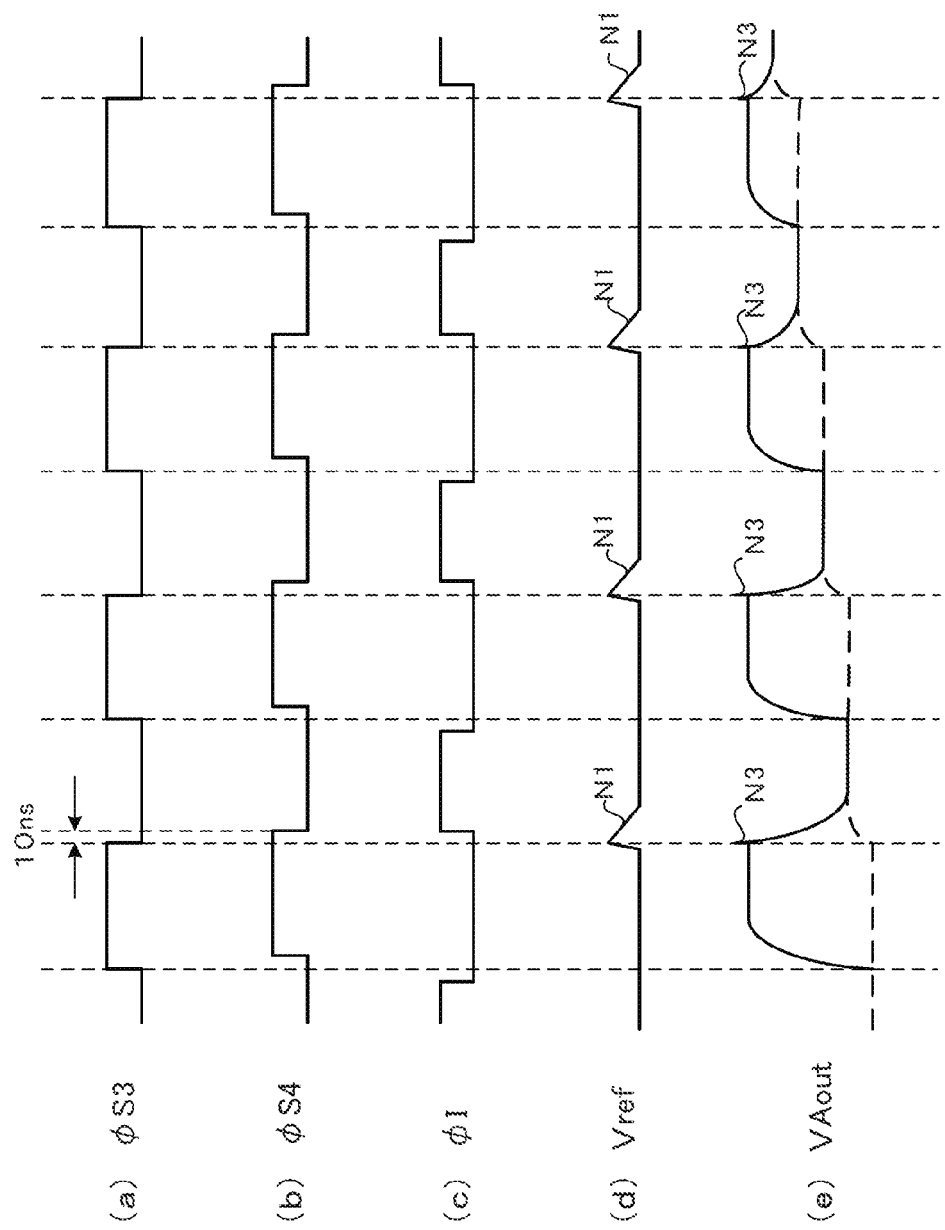
FIGS. 7(a)-(e) are diagrams illustrating an operation of the sampling circuit when periodic noise is present in a reference signal $V_{ref}$.

(a) to (e) of FIG. 7 are diagrams illustrating the operation when periodic noise is present in the reference signal $V_{ref}$ in the sampling circuit 150 shown in FIG. 1.

(a) of FIG. 7 shows a clock signal φS3 input to the switches 101_1 and 102_1 of the sampling circuit 150 shown in FIG. 1.

The clock signal φS3 is matched with the sampling timing of the reference signal $V_{ref}$ in the capacitor 111_1.

(b) of FIG. 7 shows a clock signal φS4 input to the switches 101_2 and 102_2 of the sampling circuit 150 shown in FIG. 1.

The clock signal φS4 is matched with the sampling timing of the reference signal $V_{ref}$ in the capacitor 111_2. The clock signals φS3 and φS4 are a non-overlapping clock signal which has a reversed phase of φI and which is not changed to the high level at the same time as the clock signal φI.

(c) of FIG. 7 shows the timings at which the capacitors 111_1 and 111_2 hold and discharge the charge accumulated by the reference signal $V_{ref}$, (d) of FIG. 7 shows the reference signal $V_{ref}$ which is a DC voltage, and (e) of FIG. 7 shows the output signal $V_{Aout}$ as an analog signal which is output from the operational amplifier 121.

In the first aspect, as shown in (a) and (b) of FIG. 7, the clock signal φS3 and the clock signal φS4 are changed from the high level to the low level or from the low level to the high level at different timings. The difference in timing is caused by allowing the clock signal φS4 to be changed with a time delay from the clock signal φS3. In the first aspect, the delay time T of the clock signal φS4 from the clock signal φS3 is set to 10 ns. The delay time T of the clock signal φS4 in the first aspect is not limited to 10 ns and can be set arbitrarily.

When the periodic noise N1 shown in (d) of FIG. 7 is superimposed on the reference signal $V_{ref}$, periodic noise N3 corresponding to the periodic noise N1 is superimposed on the output signal $V_{Aout}$ in the D/A converter employing the sampling circuit 150 according to the first aspect. Here, since the sampling circuit 150 according to the first aspect is driven by the clock signal φS3 and the clock signal φS4 delayed from the clock signal φS3, two sampling timings are present. Accordingly, as can be clearly seen from the comparison with the periodic noise N2 shown in FIG. 4, the periodic noise N3 is averaged and the value is suppressed.

Figure 8:
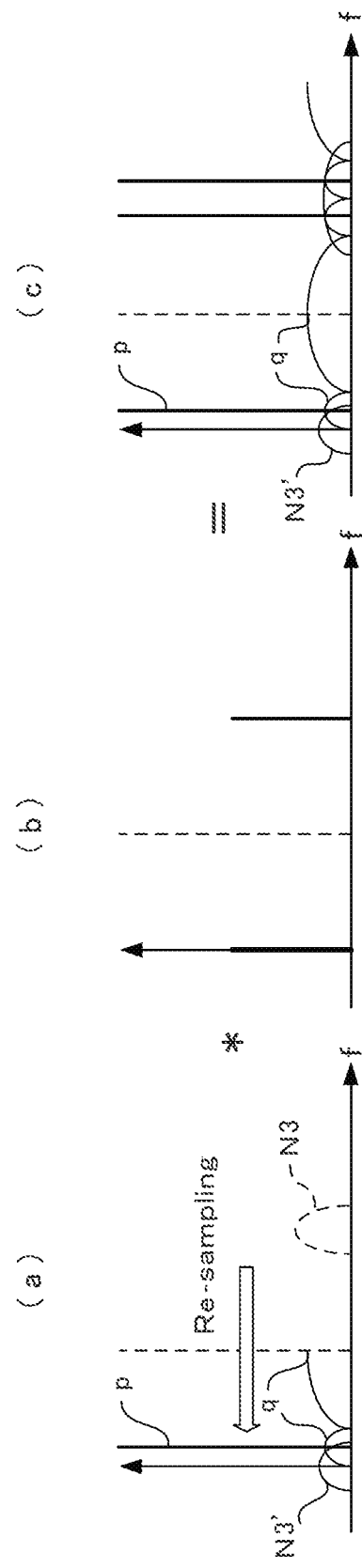
FIGS. 8(a)-(c) are diagrams illustrating a relationship between noise and frequency in the sampling circuit according to the first aspect of the present invention.

Graphs (a), (b), and (c) of FIG. 8 are diagrams illustrating the relationship between the periodic noise N3 and the frequency in the sampling circuit according to the first aspect.

Graph (a) of FIG. 8 is a graph illustrating signals output from the capacitors 111_1 and 111_2 shown in FIG. 1 and shows a spectrum obtained by transforming the input signal $V_{in}$ into a frequency axis by Fourier transform.

Graph (b) of FIG. 8 shows a spectrum obtained by transforming a clock signal for managing the timings at which the capacitors 111_1 and 111_2 hold and discharge the charge accumulated by the input signal $V_{in}$ into the frequency axis by Fourier transform. Graph (c) of FIG. 8 shows a spectrum obtained by transforming the output signal $V_{Aout}$ into the frequency axis by Fourier transform.

In any of graphs (a), (b), and (c) of FIG. 8, the vertical axis represents the spectrum intensity of a signal and the horizontal axis represents the frequency. The position of the vertical axis indicated by an arrow line in graphs (a), (b), and (c) of FIG. 8 represents the frequency reference ("0").

As shown in graph (a) of FIG. 8, since the sampling circuit 150 shown in FIG. 1 has plural timings of the sampling and holding section 150b, it is possible to spread the periodic noise due to inrush current in the analog section. Accordingly, in the first aspect, the peak of the spectrum of the periodic noise N3 can be made to be smaller than the peak of the spectrum of the periodic noise N2 shown in FIG. 5.

In the first aspect, the periodic noise N3 is replicated to generate the periodic noise N3'. However, in the first aspect in which plural sampling timings are present, the filtering effect of the FIR filter is applied at the time of replication and the spectrum of the periodic noise N3' becomes smaller than the spectrum of the periodic noise N3 as shown in FIG. 8. Accordingly, in the first aspect, the periodic noise generated in the in-band can be reduced, in comparison with the sampling circuit 150 operating with a general clock signal.

Figure 9:
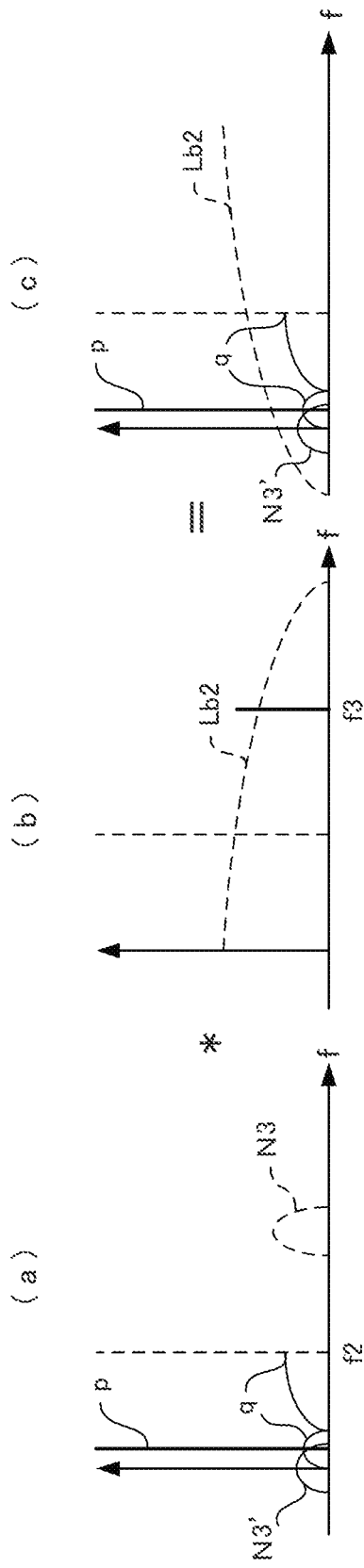
FIGS. 9(a)-(c) are diagrams further illustrating the signals shown in FIG. 8.

Graphs (a) to (c) of FIG. 9 are diagrams further illustrating the signal shown in graph (a) of FIG. 8.

Graph (a) of FIG. 9 is a diagram illustrating frequency characteristics of the periodic noise N3 superimposed on the reference signal $V_{ref}$ shown in (d) of FIG. 7 and shows a spectrum obtained by transforming the reference signal $V_{ref}$ having periodic noise N3 superimposed thereon into the frequency axis by Fourier transform.

The frequency f2 indicated by a dotted line in graph (a) of FIG. 9 represents the Nyquist frequency and is half a sampling operation frequency.

Graph (b) of FIG. 9 shows a spectrum obtained by transforming a clock signal for managing the sampling timings, at which the capacitors 111_1 and 111_2 accumulate the input signal $V_{in}$, into the frequency axis by Fourier transform.

The frequency f3 indicated by a dotted line in graph (b) of FIG. 9 is a sampling operation frequency. The frequency characteristics indicated by a dotted line Lb2 in graph (b) of FIG. 9 are frequency characteristics of the FIR filter obtained through the sampling operation.

In the first aspect, the sampling operation is performed by the clock signal φS3 and the clock signal φS4 delayed by 10 ns from the clock signal φS3. Accordingly, the frequency characteristic fc of the FIR filter in the first aspect is expressed by Expression (1).

$$fc=1/(2\times T)+X/T(\text{Hz}) \qquad \text{Expression (1)}$$

Here, X in Expression 1 represents an integer.

In the first aspect, since the delay time T is 10 ns, the FIR filter having a zero point in fc=50 MHz+100×X MHz (only fc=50 MHz which is a solution at X=0 is shown in FIG. 9) is formed.

Graph (c) of FIG. 9 shows a spectrum obtained by transforming the output signal $V_{Aout}$ into the frequency axis by Fourier transform.

In any of graphs (a), (b), and (c) of FIG. 9, the vertical axis represents the spectrum intensity of a signal and the horizontal axis represents the frequency. The position of the vertical axis indicated by an arrow line in graphs (a), (b), and (c) of FIG. 9 represents the frequency reference ("0").

As shown in FIG. 9, the noise component at the time of sampling is suppressed due to the filtering effect of the FIR filter in the sampling operation to the capacitors 111_1 and 111_2 shown in FIG. 1, and the spectrum of the periodic noise N3 is attenuated and turns to the periodic noise N3'.

According to the first aspect, since the filtering effect can be exhibited during modulation from the periodic noise N3 shown in FIG. 8 to the periodic noise N3', the periodic noise generated in the in-band of the D/A converter can be reduced. The periodic noise is also generated, for example, in an A/D converter mounted on the same substrate as the D/A converter as well as the D/A converter. Accordingly, when the sampling circuit 150 according to the first aspect is applied to an electronic component of which the operation is affected by the periodic noise, it is possible to remarkably reduce the periodic noise of the electronic component. The first aspect is advantageous for a decrease in the size of an electronic device and simplification in configuration.

A concept of a sampling circuit and an A/D converter using the sampling circuit according to the present invention will be described below.

A sampling circuit described herein (hereinafter, referred to as "second aspect") is a sampling circuit serving as a basis of Embodiment 2 to be described later.

Figure 10:
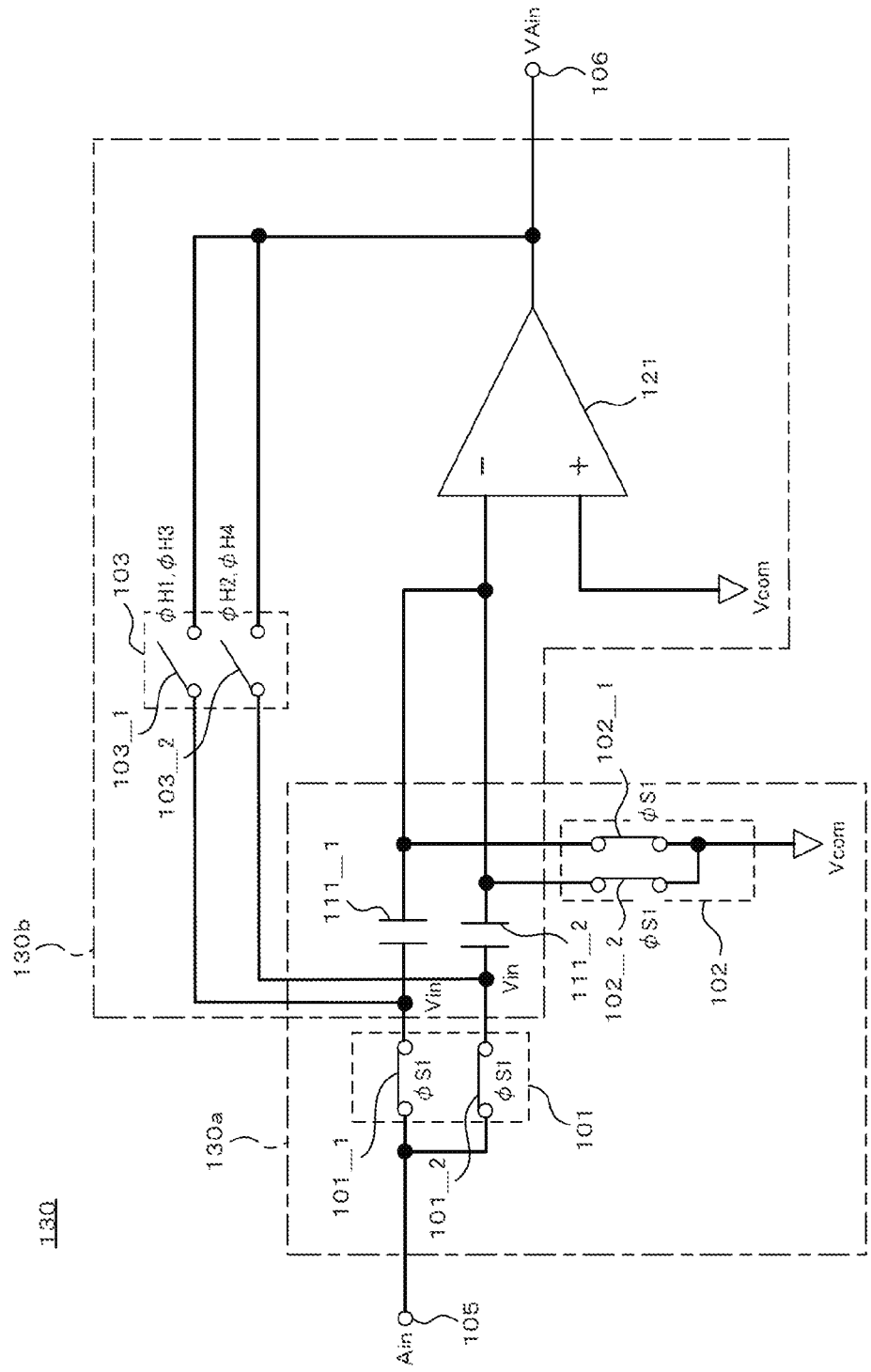
FIG. 10 is a diagram illustrating a sampling circuit according to a second aspect of the present invention.

FIG. 10 is a diagram illustrating a sampling circuit according to a second aspect.

The sampling circuit 130 shown in FIG. 10 includes a digital section, a sampling and holding section, and a continuous section. The digital section is constructed by a general digital circuit and is configured to transmit a signal which is quantized and sampled. The sampling and holding section is constructed by a general switched capacitor circuit (SC circuit) and is configured to transmit a signal which is not quantized and sampled. The continuous section is constructed by a general continuous signal circuit (continuous circuit) and is configured to transmit a signal which is not quantized and not sampled.

In FIG. 10, the digital section handling a digital signal out of the above-mentioned configuration is not shown, but a continuous section 130a and a sampling and holding section 130b are shown. The digital section is disposed in the rear stage of the sampling and holding section 130b shown in FIG. 10.

The continuous section 130a includes switches 1011, 101_2, 102_1, and 102_2 and capacitors 111_1 and 111_2. The switch 101_1, the capacitor 111_1, and the switch 102_1 are connected in series to each other. Similarly, the switch 101_2, the capacitor 111_2, and the switch 102_2 are connected in series to each other. The switches 101_1 and 101_2 constitute a switch unit 101, and the switches 102_1 and 102_2 constitute a switch unit 102.

The sampling and holding section 130b includes capacitors 111_1 and 111_2, an operational amplifier 121 of which the inverting input terminal is connected to ends of the capacitors, a switch 103_1 connected to the output terminal of the operational amplifier 121 and a node between the switch 101_1 and the capacitor 111_1, and a switch 103_2 connected to the output terminal of the operational amplifier 121 and a node between the switch 101_2 and the capacitor 111_2. The switches 103_1 and 103_2 constitute a switch unit 103.

The output terminal of the operational amplifier 121 is connected to a terminal 106, and an analog output signal $V_{Aout}$ is output from the terminal 106. The non-inverting input terminal and the inverting input terminal of the operational amplifier 121 are supplied with a standard signal $V_{com}$ of a common mode voltage via the switches 102_1 and 102_2.

In the sampling circuit 130 shown in FIG. 10, the sampling and holding section 130b and the continuous section 130a share the capacitors 111_1 and 111_2. That is, the capacitors 111_1 and 111_2 serve as the sampling and holding section 130b and also serve as the continuous section 130a.

An analog input signal $A_{in}$ is input to the sampling circuit 130 from the terminal 105. The analog input signal $A_{in}$ is sampled by the switches 101_1 and 102_1. Charges are accumulated in the capacitor 111_1 by this sampling. The analog input signal $A_{in}$ is sampled by the switches 101_2 and 102_2 and charge are accumulated in the capacitor 111_2. The analog input signal $A_{in}$ sampled by the switches 101_1, 101_2, 102_1, and 102_2 are referred to as an input signal $V_{in}$.

The charge accumulated in the capacitors 111_1 and 111_2 are input to the inverting input terminal of the operational amplifier 121 by switching of the switches 101_1, 102_1, 103_1, and the switching of the switches 101_2, 102_2, and 103_2. The operational amplifier 121 receives an input of the standard signal $V_{com}$ from the non-inverting input terminal and outputs an analog output signal $V_{Aout}$.

In the sampling circuit 130 shown in FIG. 10, plural (two in the example shown in FIG. 10) capacitors 111_1 and 111_2 are provided to the continuous section 130a. The number of switches included in the switch unit 103 of the sampling and holding section 130b corresponds to the number of capacitors 111_1 and 111_2.

The number of capacitors 111_1 and 111_2 of the continuous section 130a in the second aspect is not limited to two and may be a natural number M. In this case, each of the switch unit 103 of the sampling and holding section 130b include M switches.

In the sampling circuit 130 shown in FIG. 10, as the number M of capacitors 111_1 and 111_2 increases, the number of switches included in the switch unit 103 increases accordingly. If the number of capacitors 111_1 and 111_2 increases, the configuration of the sampling and holding section 130b will not change from the configuration as shown in FIG. 10, except that the number of switches included in the switch unit 103 increases.

In the sampling circuit 130 shown in FIG. 10, as the number M of capacitors 111_1 and 111_2 increases, the number of switches included in the switch units 101 and 102 increases accordingly. If the number of capacitors 111_1 and 111_2 increases, the configuration of the continuous section 130a will not change from the configuration as shown in FIG. 10, except that the number of switches included in the switch units 101 and 102 increases.

When capacitors are added to the continuous section 130a shown in FIG. 10, the total capacity of the capacitors after the adding is equal to the total capacity of the capacitors 111_1 and 111_2. By employing this configuration, the capacity magnitude and the operation timing of the capacitors 111_1 and 111_2 can be appropriately distributed to form an analog FIR (Finite Impulse Response) filter that lowers the gain of a specific frequency included in the output signal $V_{Ain}$.

In the second aspect, the switches 101_1 and 101_2 and the switches 102_1, and 102_2 are driven by a clock signal $\phi S1$ different from any of the clock signals for driving the switches 103_1 and 103_2. The switch 103_1 and the switch 103_2 are driven by different clock signals $\phi H1$ and $\phi H2$.

Here, the operation of the configuration of the second aspect will be described that the second aspect achieve an effect capable of reducing noise generated by an A/D converter using the sampling circuit 130 shown in FIG. 10 even when periodic noise (noise due to inrush current in a circuit managing an analog signal: hereinafter, simply referred to as noise) is superimposed on the reference signal $V_{ref}$.

In the below description, for the purpose of easy understanding of the effect of the second aspect, a case where the switch 101_1 and the switch 101_2 of the sampling circuit 130 shown in FIG. 10 are driven by clock signals of the same timing, the switch 102_1 and the switch 102_2 are driven by clock signals of the same timing, and the switch 103_1 and the switch 103_2 are driven by clock signals of the same timing, (hereinafter, referred to as "driving using a general clock signal") will be first described.

The output signal $V_{Ain}$ when the sampling circuit 130 shown in FIG. 10 is driven by general clock signals will be described for two cases of a case where periodic noise is not superimposed on the standard signal $V_{com}$ and a case where periodic noise is imposed on the standard signal.

In the sampling circuit 130 shown in FIG. 10, when periodic noise is superimposed on the standard signal $V_{com}$, the periodic noise appears in an output waveform with a gain of 0 dB. Accordingly, the sensitivity of the sampling circuit 130 to noise is the highest.

Figure 11:
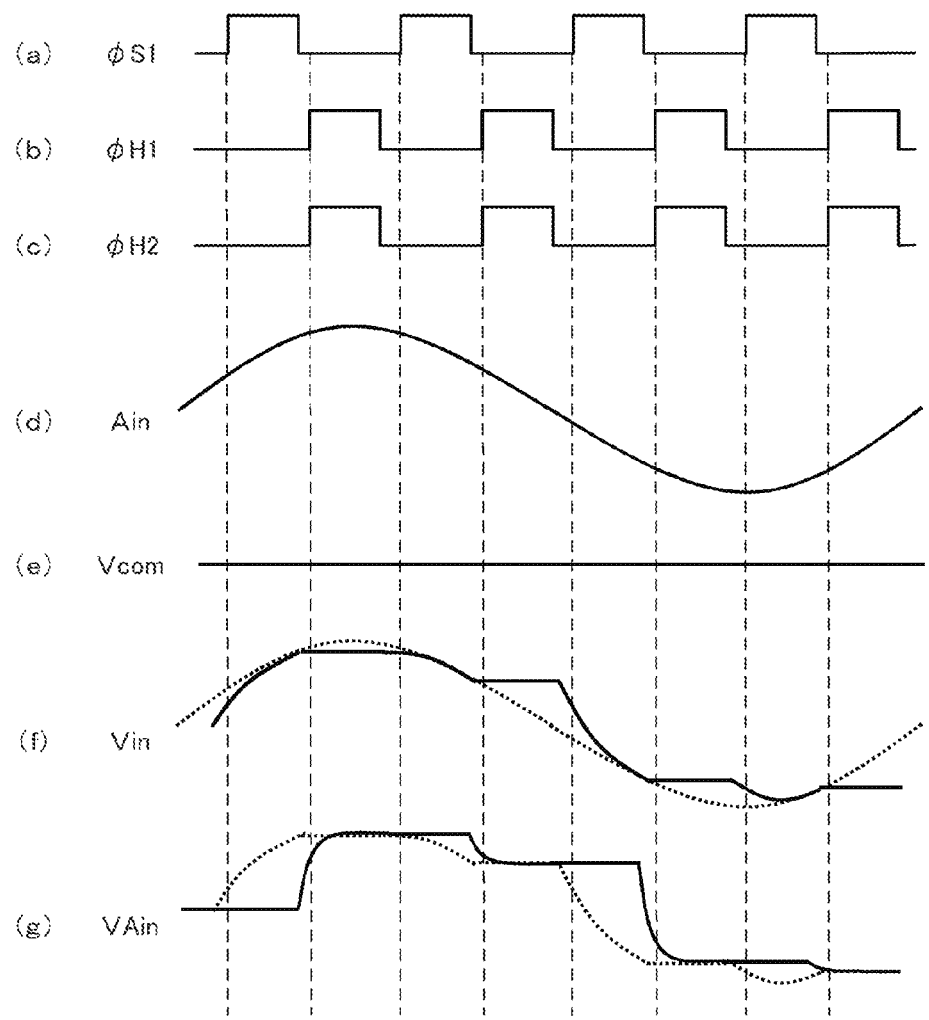
FIGS. 11 (a)-(g) are diagrams illustrating an operation of the sampling circuit when periodic noise is not present in a standard signal $V_{com}$.

(a) to (g) of FIG. 11 are diagrams illustrating the operation of an A/D converter including the sampling circuit 130 shown in FIG. 10 when periodic noise is not present in the standard signal $V_{com}$.

(a) of FIG. 11 shows a clock signal φS1 for driving the switches 101_1, 101_2, 102_1, and 102_2.

The clock signal φS1 is matched with the sampling timing of the analog input signal $A_{in}$ in the capacitors 111_1 and 111_2.

(b) of FIG. 11 shows the clock signal φH1 for driving the switch 103_1.

The clock signal φH1 is matched with the timing at which the capacitor 111_1 holds and discharges the charge accumulated by the input signal $V_{in}$.

(c) of FIG. 11 shows the clock signal φH2 for driving the switch 103_2.

The clock signal φH2 is matched with the timing at which the capacitor 111_2 holds and discharges the charge accumulated by the input signal $V_{in}$. Since the clock signal φH1 and the clock signal φH2 are equal to each other, the capacitor 111_1 and the capacitor 111_2 in the sampling circuit 130 shown in FIG. 10 operate at the same timing. The clock signal φS1 is a reverse-phased and non-overlapping clock signal which is not changed to the high level at the same time as any of the clock signals φH1 and φH2.

(d) of FIG. 11 shows the analog input signal $A_{in}$.

(e) of FIG. 11 shows the standard signal $V_{com}$ which is a DC voltage. (f) of FIG. 11 is a diagram illustrating the input signal $V_{in}$ shown in FIG. 10, where the signal indicated by a solid line represents the input signal $V_{in}$ generated by the charge transmitted from the capacitors 111_1 and 111_2.

The signal indicated by a dotted line in (f) of FIG. 11 represents the analog input signal $A_{in}$. When the analog input signal $A_{in}$ is sampled, held, and discharged by the switches 101_1, 102_1, and 103_1 and the switches 101_2, 102_2, and 103_2, the input signal $V_{in}$ is generated.

(g) of FIG. 11 shows the analog output signal $V_{Ain}$ output from the operational amplifier 121.

In (g) of FIG. 11, the signal indicated by a dotted line represents the analog input signal $V_{in}$ generated by the charge transmitted from the capacitors 111_1 and 111_2, and the output signal $V_{Ain}$ indicated by the solid line is generated by feeding back the analog input signal $V_{in}$ via the switches 103_1 and 103_2.

Figure 12:
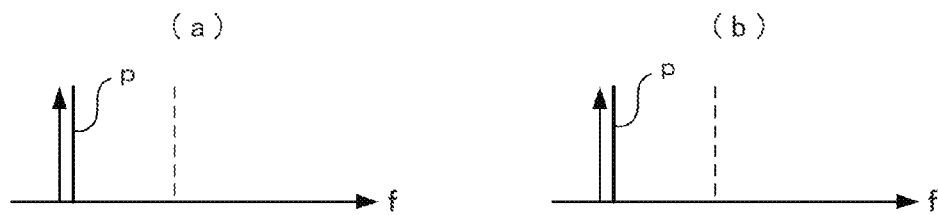
FIGS. 12(a)-(b) are diagrams illustrating a signal output from the sampling circuit.

FIG. 12 is a diagram illustrating the signal output from the sampling circuit.

Graph (a) of FIG. 12 is a diagram illustrating signals output from the capacitors 111_1 and 111_2 shown in FIG. 10 and shows a spectrum obtained by transforming the input signal $V_{in}$ into a frequency axis by Fourier transform.

Graph (b) of FIG. 12 shows a spectrum obtained by transforming $V_{Ain}$ which is the output signal of the operational amplifier 121 into the frequency axis by Fourier transform.

In any of graphs (a) and (b) of FIG. 12, the vertical axis represents the spectrum intensity of a signal and the horizontal axis represents the frequency. The position of the vertical axis indicated by an arrow line in graphs (a) and (b) of FIG. 12 represents the frequency reference ("0").

As shown in FIG. 12, the signal (indicated by a spectrum p in the drawing) output from the capacitors 111_1 and 111_2 has a constant frequency. When the spectrum p and is sampled by the switches 101_1, 102_1, 101_2, and 102_2 and are held and discharged, the output signal $V_{Ain}$ shown in (b) of FIG. 12 is generated.

A case where periodic noise is present in the standard signal $V_{com}$ will be described below.

In this case, it is assumed that the switches 101_1 and 101_2 are driven by clock signals of the same timing, the switches 102_1 and 102_2 are driven by clock signals of the same timing, the switches 103_1 and 103_2 are driven by clock signals of the same timing, and the switches 104_1 and 104_2 are driven by clock signals of the same timing.

Figure 13:
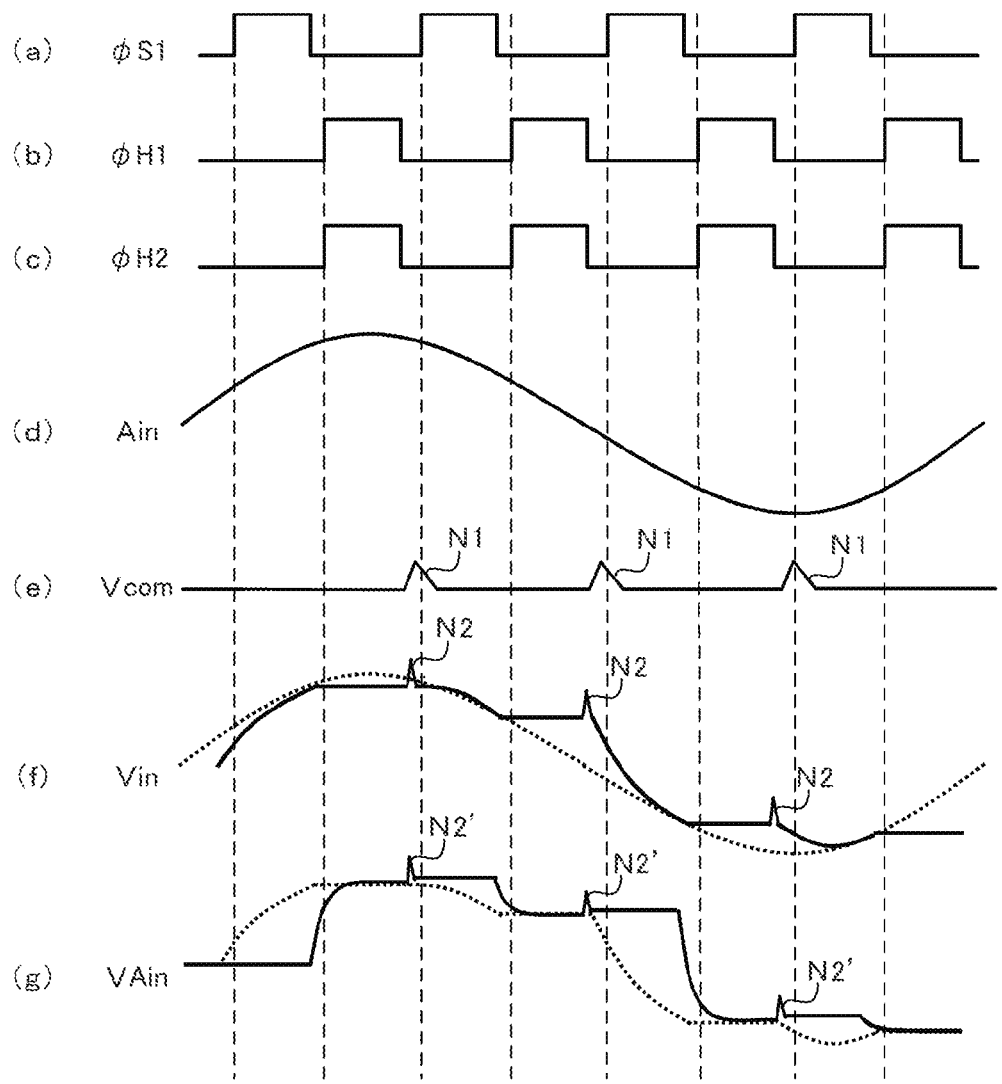
FIGS. 13(a)-(g) are diagrams illustrating an operation of the sampling circuit when periodic noise is present in a standard signal $V_{com}$.

(a) to (g) of FIG. 13 are diagrams illustrating the operation of the A/D converter when periodic noise is present in the standard signal $V_{com}$ in the sampling circuit 130 shown in FIG. 10.

(a) of FIG. 13(a) shows the sampling timing of the analog input signal $A_{in}$ in the capacitors 111_1 and 111_2, (b) of FIG. 13 shows the timing at which the capacitor 111_1 holds and discharges the charge accumulated by the input signal $V_{in}$, and (c) of FIG. 13 shows the timing at which the capacitor 111_2 holds and discharges the charge accumulated by the input signal $V_{in}$.

(d) of FIG. 13 shows the analog input signal $A_{in}$ and (e) of FIG. 13 shows the standard signal $V_{com}$ which is a DC voltage.

In (f) of FIG. 13, the signal indicated by a solid line represents the input signal $V_{in}$ generated by the charge transmitted from the capacitors 111_1 and 111_2.

(g) of FIG. 13 shows the analog output signal $V_{Ain}$ output from the operational amplifier 121.

The clock signal φH1 shown in (b) of FIG. 13 and the clock signal φH2 shown in (c) of FIG. 13 operate at the same timing. As can be clearly seen from (e), (f), and (g) of FIG. 13, when the periodic noise N1 is superimposed on the standard signal $V_{com}$ shown in (e) of FIG. 13, periodic noise N2' corresponding to the periodic noise N1 is generated in the input signal $V_{in}$.

The periodic noises shown in (d), (f), and (g) of FIG. 13 will be described below with reference to graphs (a) and (b) of FIG. 14.

Figure 14:
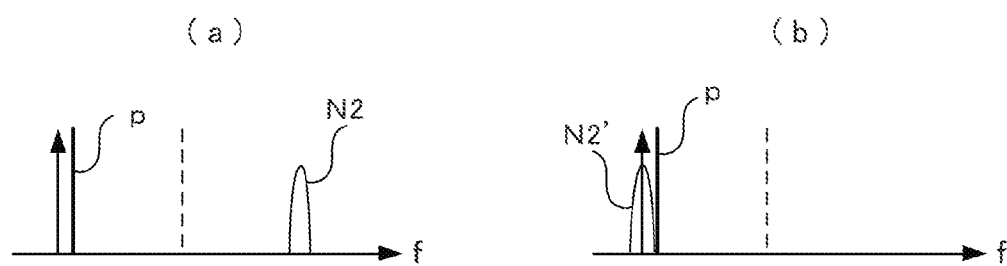
FIGS. 14(a)-(b) are diagrams illustrating periodic noise.

FIG. 14 is a diagram illustrating the signals output from the capacitors 111_1 and 111_2 shown in FIG. 10. Graph (a) of FIG. 14 shows a spectrum p obtained by transforming the input signal $V_{in}$ into a frequency axis by Fourier transform.

Graph (b) of FIG. 14 shows a spectrum p obtained by transforming $V_{Ain}$ which is the output signal of the operational amplifier 121 into the frequency axis by Fourier transform.

In any of graphs (a) and (b) of FIG. 14, the vertical axis represents the spectrum intensity of a signal and the horizontal axis represents the frequency. The position of the vertical axis indicated by an arrow line in graphs (a) and (b) of FIG. 14 represents the frequency reference ("0").

When the spectrum p shown in graph (a) of FIG. 14 are sampled by the switches 101_1, 102_1, 101_2, and 102_2 shown in FIG. 10 and are held and discharged, periodic noise N2 is replicated and appears as periodic noise N2' in the vicinity of the DC as shown in (b) of FIG. 14. The periodic noise N2' appears in the frequency band (hereinafter, also referred to as in-band) used for an output audio, when the A/D converter is used, for example, in an audio device.

The second aspect has been made on the basis of a technical thought that periodic noise appearing in the in-band due to a signal output from another device is spread and signal quality of an output signal such as an audio is prevented from being damaged, by using plural different clock signals of causing a device such as a sampling circuit to operate.

The signals output from the capacitors 111_1 and 111_2 and shown in graph (a) of FIG. 14 will be described in more detail with reference to graphs (a) to (c) of FIG. 15.

Figure 15:
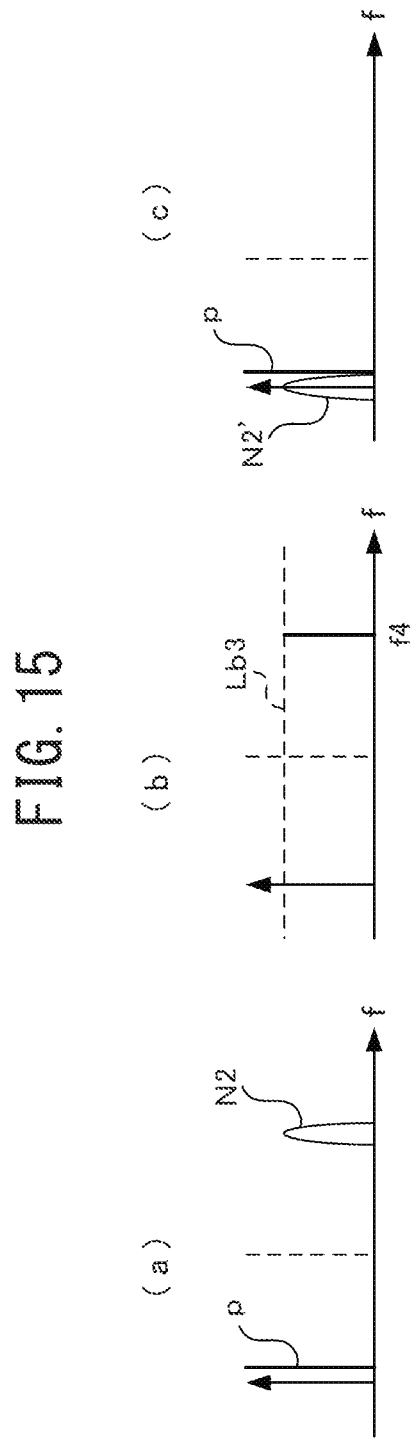
FIGS. 15(a)-(c) are diagrams illustrating a signal output from a capacitor.

Graph (a) of FIG. 15 shows frequency characteristics of the input signal $V_{Ain}$ shown in (g) of FIG. 13 and shows a spectrum obtained by transforming $V_{Ain}$ having periodic noise superimposed thereon into the frequency axis by Fourier transform.

The frequency indicated by a dotted line in graph (a) of FIG. 15 represents the Nyquist frequency and is half a sampling operation frequency.

Graph (b) of FIG. 15 shows a spectrum obtained by transforming a clock signal for managing the sampling timings, at which the capacitors 111_1 and 111_2 accumulate the input signal $V_{in}$, into the frequency axis by Fourier transform.

The frequency f4 indicated by a dotted line in graph (b) of FIG. 15 represents the Nyquist frequency and is half a sampling operation frequency. The frequency characteristics (F characteristics) indicated by a dotted line Lb3 in graph (b) of FIG. 15 are frequency characteristics of the FIR filter obtained through the sampling operation.

Here, since the sampling operation is performed using a single clock signal, the frequency characteristics of the FIR filter provide an all-pass filter (a gain suppression effect is not exhibited for all frequencies). Graph (c) of FIG. 15 shows a spectrum obtained by transforming the input signal $V_{Ain}$ into the frequency axis by Fourier transform. In any of graphs (a), (b), and (c) of FIG. 15, the vertical axis represents the spectrum intensity of a signal and the horizontal axis represents the frequency. The position of the vertical axis indicated by an arrow line in graphs (a), (b), and (c) of FIG. 15 represents the frequency reference ("0").

As shown in graph (c) of FIG. 15, the filtering effect due to the FIR filter is not obtained in the sampling operations of the capacitors 111_1 and 111_2 shown in FIG. 10. Accordingly, the spectrum of the periodic noise N2 is replicated to periodic noise N2' without any change.

The second aspect has been made by paying attention to the thought that the signal quality in the in-band can be enhanced by spreading the periodic noise N2'. Accordingly, the sampling and holding section 130b of the sampling circuit 130 operates by plural clock signals.

The plural clock signals in the second aspect will be described below.

Figure 16:
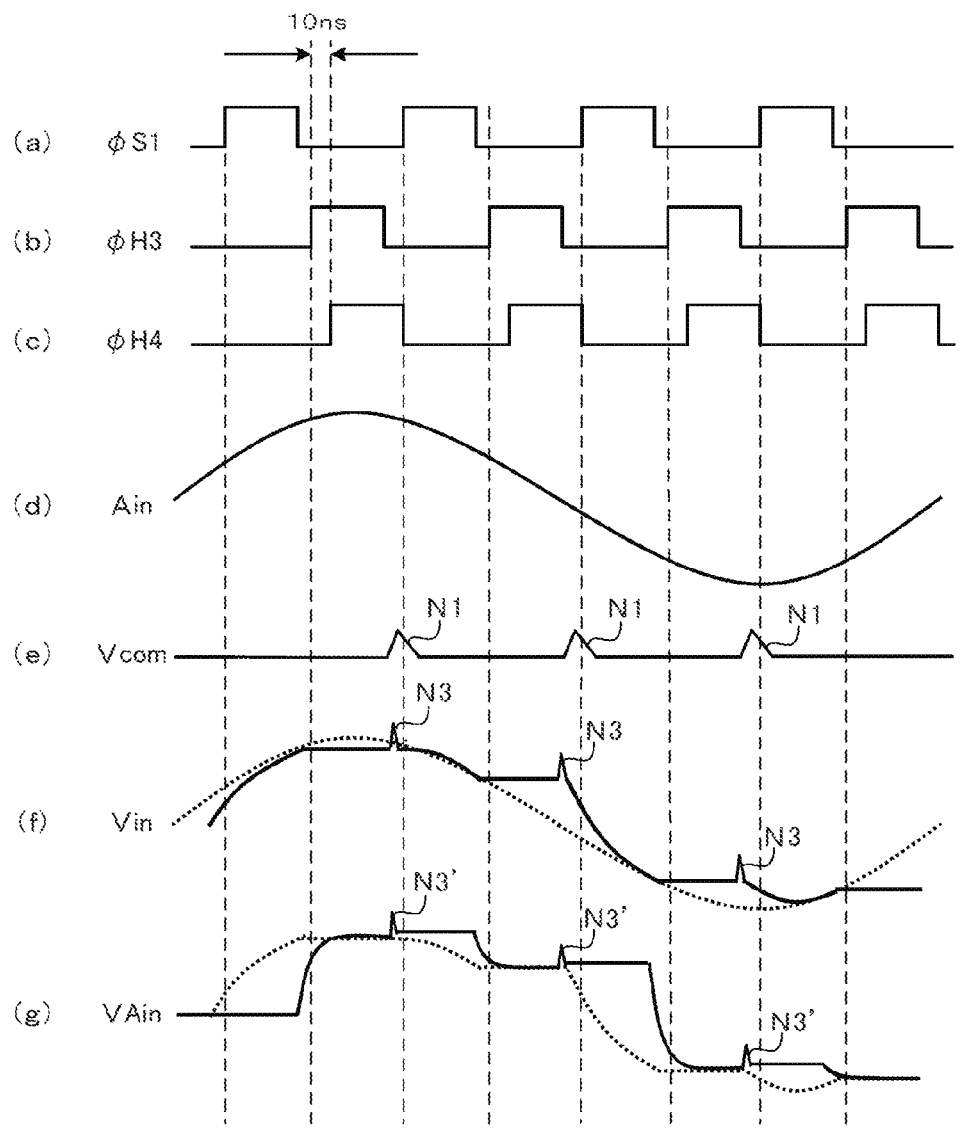
FIGS. 16(a)-(g) are diagrams illustrating an operation of the sampling circuit when periodic noise is present in a standard signal $V_{com}$.

(a) to (g) of FIG. 16 are diagrams illustrating the operation when periodic noise is present in the standard signal $V_{com}$ in the sampling circuit 130 shown in FIG. 10.

(a) of FIG. 16 shows a clock signal φS1 for driving the switches included in the switch units 101 and 102.

The clock signal φS1 is matched with the sampling timing of the analog input signal $A_{in}$ in the capacitors 111_1 and 111_2.

(b) of FIG. 16 shows the clock signal φH3 for driving the switch 103_1.

The clock signal φH3 is matched with the timing at which the capacitor 111_1 holds and discharges the charge accumulated by the input signal $V_{in}$.

(c) of FIG. 16 shows the clock signal φH4 for driving the switch 103_2.

The clock signal φH4 is matched with the timing at which the capacitor 111_2 holds and discharges the charge accumulated by the input signal $V_{in}$.

The clock signal φS1 is a reverse-phased and non-overlapping clock signal which is not changed to the high level at the same time as any of the clock signals φH3 and φH4.

(d) of FIG. 16 shows the analog input signal $A_{in}$. (e) of FIG. 16 shows the standard signal $V_{com}$ which is a DC voltage. In (f) of FIG. 16, the signal indicated by a solid line represents the input signal $V_{in}$ generated by the charge transmitted from the capacitors 111_1 and 111_2.

(g) of FIG. 16 shows the analog output signal $V_{Ain}$ output from the operational amplifier 121.

In the second aspect, as shown in (b) and (c) of FIG. 16, the clock signal φH3 and the clock signal φH4 are changed from the high level to the low level or from the low level to the high level at different timings. The difference in timing is caused by allowing the clock signal φH4 to be changed with a time delay from the clock signal φH3. In the second aspect, the delay time T of the clock signal φH4 from the clock signal φH3 is set to 10 ns. The delay time T of the clock signal φH4 in the second aspect is not limited to 10 ns and can be set arbitrarily.

When the periodic noise N1 shown in (e) of FIG. 16 is superimposed on the standard signal $V_{com}$, periodic noise N3' corresponding to the periodic noise N1 is superimposed on the in the sampling circuit 130 according to the second aspect. Here, since the sampling circuit 130 according to the second aspect is driven by the clock signal φH3 and the clock signal φH4 delayed from the clock signal φH3, two sampling timings are present. Accordingly, as can be clearly seen from the comparison with the periodic noise N2' shown in FIG. 13, the periodic noise N3' is averaged and the value is suppressed.

Figure 17:
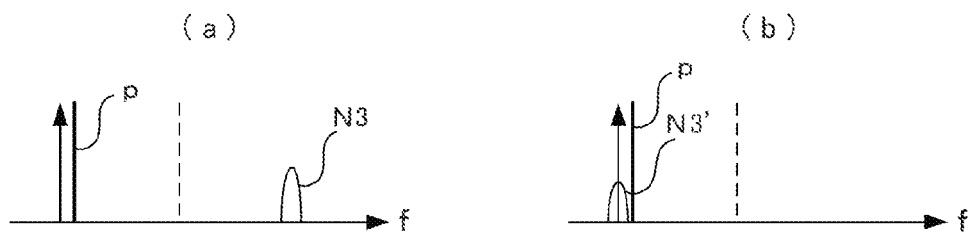
FIGS. 17(a)-(b) are diagrams illustrating a relationship between noise and frequency in the sampling circuit according to the second aspect of the present invention.

Graphs (a) and (b) of FIG. 17 are diagrams illustrating the relationship between the periodic noise N3 and the frequency in the sampling circuit according to the second aspect.

Graph (a) of FIG. 17 is a graph illustrating signals output from the capacitors 111_1 and 111_2 shown in FIG. 10 and shows a spectrum obtained by transforming the input signal $V_{in}$ into a frequency axis by Fourier transform.

Graph (b) of FIG. 17 shows a spectrum obtained by transforming $V_{Ain}$ which is the output signal of the operational amplifier 121 into the frequency axis by Fourier transform.

In any of graphs (a) and (b) of FIG. 17, the vertical axis represents the spectrum intensity of a signal and the horizontal axis represents the frequency. The position of the vertical axis indicated by an arrow line in graphs (a) and (b) of FIG. 17 represents the frequency reference ("0").

As shown in graph (a) of FIG. 17, since the sampling circuit 130 shown in FIG. 10 has plural timings of the sampling and holding section 130b, it is possible to spread the periodic noise due to inrush current in the analog section. Accordingly, in the second aspect, the peak of the spectrum of the periodic noise N3 can be made to be smaller than the peak of the spectrum of the periodic noise N2 shown in FIG. 15.

In the second aspect, the periodic noise N3 is replicated to generate the periodic noise N3'. However, in the second aspect in which plural sampling timings are present, the filtering effect of the FIR filter is applied at the time of replication and the spectrum of the periodic noise N3' becomes smaller than the spectrum of the periodic noise N3. Accordingly, in the second aspect, the periodic noise generated in the in-band can be reduced, in comparison with the sampling circuit 130 operating with a general clock signal.

Figure 18:
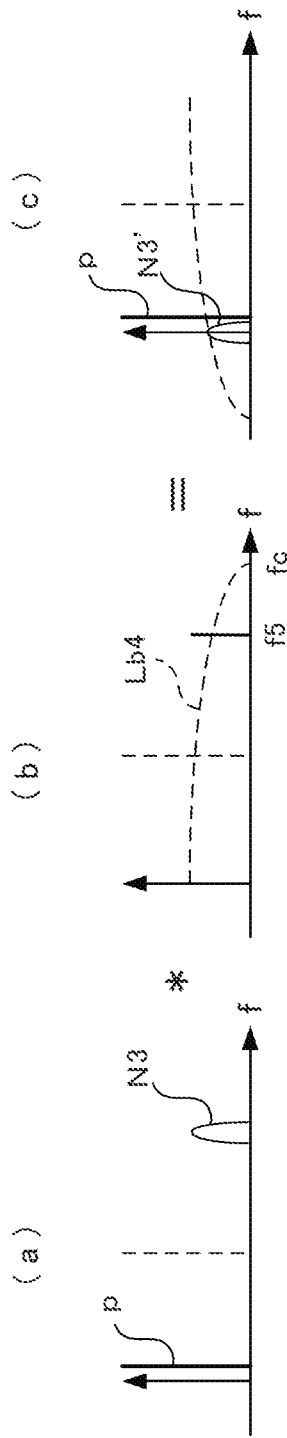
FIGS. 18(a)-(c) are diagrams further illustrating the signal output from the capacitor.

Graphs (a) to (c) of FIG. 18 are diagrams further illustrating the signal shown in graph (a) of FIG. 17.

Graph (a) of FIG. 18 is a diagram illustrating frequency characteristics of the input signal $V_{in}$ shown in (g) of FIG. 16 and shows a spectrum obtained by transforming $V_{Ain}$ having periodic noise superimposed thereon into the frequency axis by Fourier transform.

The frequency indicated by a dotted line in graph (a) of FIG. 18 represents the Nyquist frequency and is half a sampling operation frequency.

Graph (b) of FIG. 18 shows a spectrum obtained by transforming a clock signal for managing the sampling timings, at which the capacitors 111_1 and 111_2 accumulate the input signal $V_{in}$, into the frequency axis by Fourier transform.

The frequency f5 indicated by a dotted line in graph (b) of FIG. 18 is a sampling operation frequency. The frequency characteristics indicated by a dotted line Lb4 in graph (b) of FIG. 18 are frequency characteristics of the FIR filter obtained through the sampling operation.

In the second aspect, the sampling operation is performed by the clock signal φH3 and the clock signal φH4 delayed by 10 ns from the clock signal φH3. Accordingly, the frequency characteristic fc of the FIR filter in the second aspect is expressed by Expression 1.

In the second aspect, since the delay time T is 10 ns, the FIR filter having a zero point in fc=50 MHz+100×X MHz (only fc=50 MHz which is a solution at X=0 is shown in FIG. 18) is formed.

Graph (c) of FIG. 18 shows a spectrum obtained by transforming the output signal $V_{Ain}$ into the frequency axis by Fourier transform.

In any of graphs (a), (b), and (c) of FIG. 18, the vertical axis represents the spectrum intensity of a signal and the horizontal axis represents the frequency. The position of the vertical axis indicated by an arrow line in graphs (a), (b), and (c) of FIG. 18 represents the frequency reference ("0").

As shown in FIG. 18, the noise component at the time of sampling is suppressed due to the filtering effect of the FIR filter in the sampling operation to the capacitors 111_1 and 111_2 shown in FIG. 10, and the spectrum of the periodic noise N3 is attenuated and turns to the periodic noise N3'.

According to the second aspect, since the filtering effect can be exhibited during modulation from the periodic noise N3 shown in FIG. 17 to the periodic noise N3', the periodic noise generated in the in-band of the A/D converter can be reduced. The periodic noise is also generated, for example, in a D/A converter mounted on the same substrate as the A/D converter as well as the A/D converter. Accordingly, when the sampling circuit 130 according to the second aspect is applied to an electronic component of which the operation is affected by the periodic noise, it is possible to remarkably reduce the periodic noise of the electronic component. The second aspect is advantageous for a decrease in the size of an electronic device and simplification in configuration.

Embodiment 1, Embodiment 2, and Embodiment 3 of the present invention based on the above-mentioned concept will be described below.

First, a D/A converter according to Embodiment 1 employing the sampling circuit according to the present invention will be described.

Embodiment 1-1 will be first described.

Figure 19:
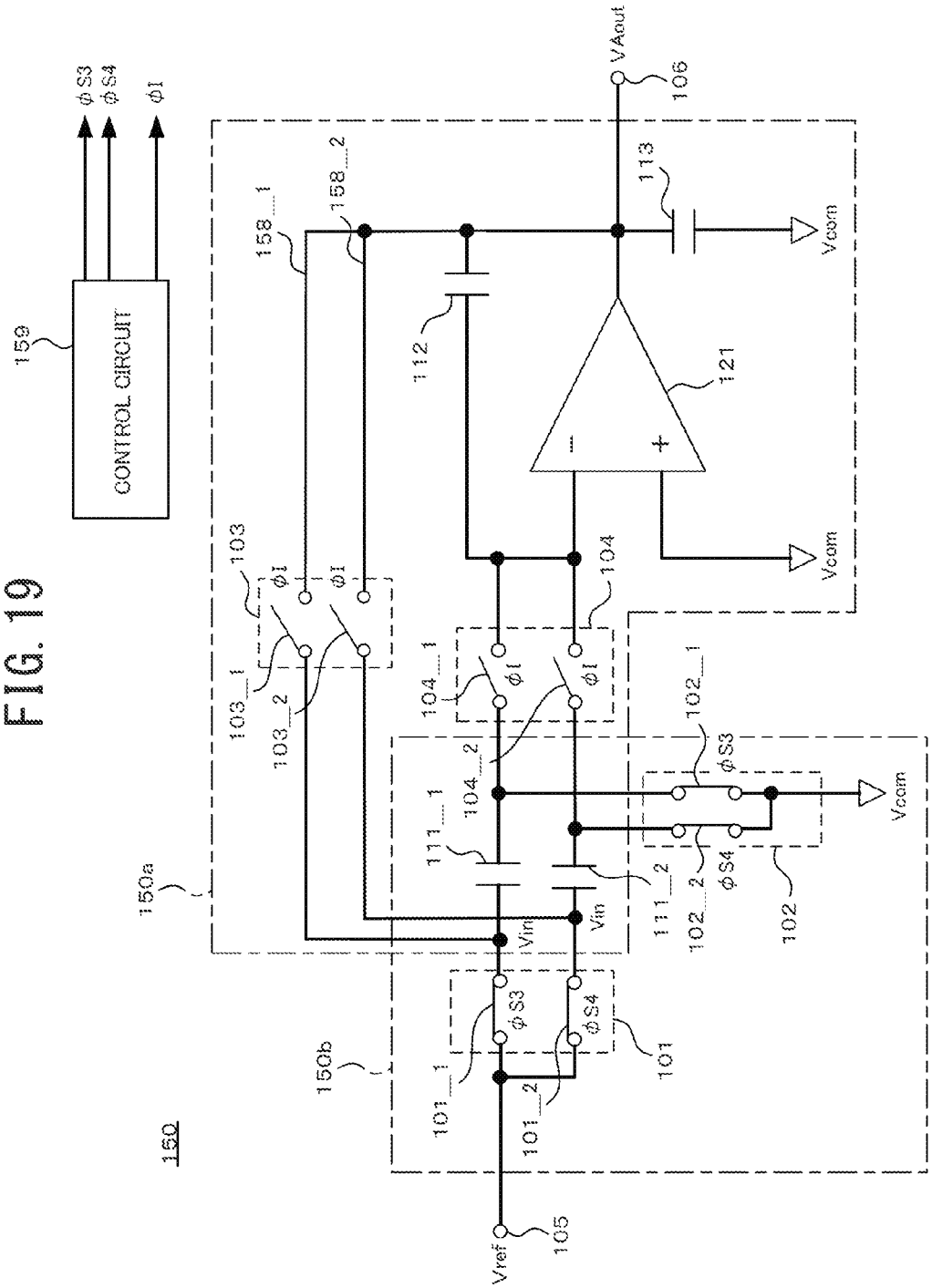
FIG. 19 is a diagram illustrating a D/A converter according to Embodiment 1-1 of the present invention.

FIG. 19 is a diagram illustrating a D/A converter according to Embodiment 1-1.

As shown in FIG. 19, the D/A converter according to Embodiment 1 includes a sampling circuit 150 shown in FIG. 1 and a control circuit 159 that outputs the clock signals clock signal φS3, φS4, and φI for driving the sampling circuit 150.

In FIG. 19, the same elements as shown in FIG. 1 will be referenced by the same reference numerals and partial description thereof will not be repeated.

As shown in FIG. 1, the sampling circuit 150 includes a digital section not shown, a continuous section 150a, and a sampling and holding section 150b. The control circuit 159 generates and outputs the clock signal φS3, φS4, and φI shown in (a) and (b) of FIG. 7. The clock signal φI is input to the continuous section 150a, and the clock signal φS3 is input to the switches 101_1 and 102_1 of the sampling and holding section 150b. The clock signal φS4 is input to the switches 101_2 and 102_2 of the sampling and holding section 150b. The clock signal φS3, φS4, and φI drive the switches so that the switches are turned on when the clock signals are at the high level and the switches are turned off when the clock signals are at the low level. As shown in (a) to (c) of FIG. 7, the clock signal φI is a non-overlapping clock signal which is not changed to the high level at the same time as any of the clock signal φS3 and φS4. The clock signal φS4 is a signal obtained by delaying the clock signal φS3 by a delay time T.

Figure 20:
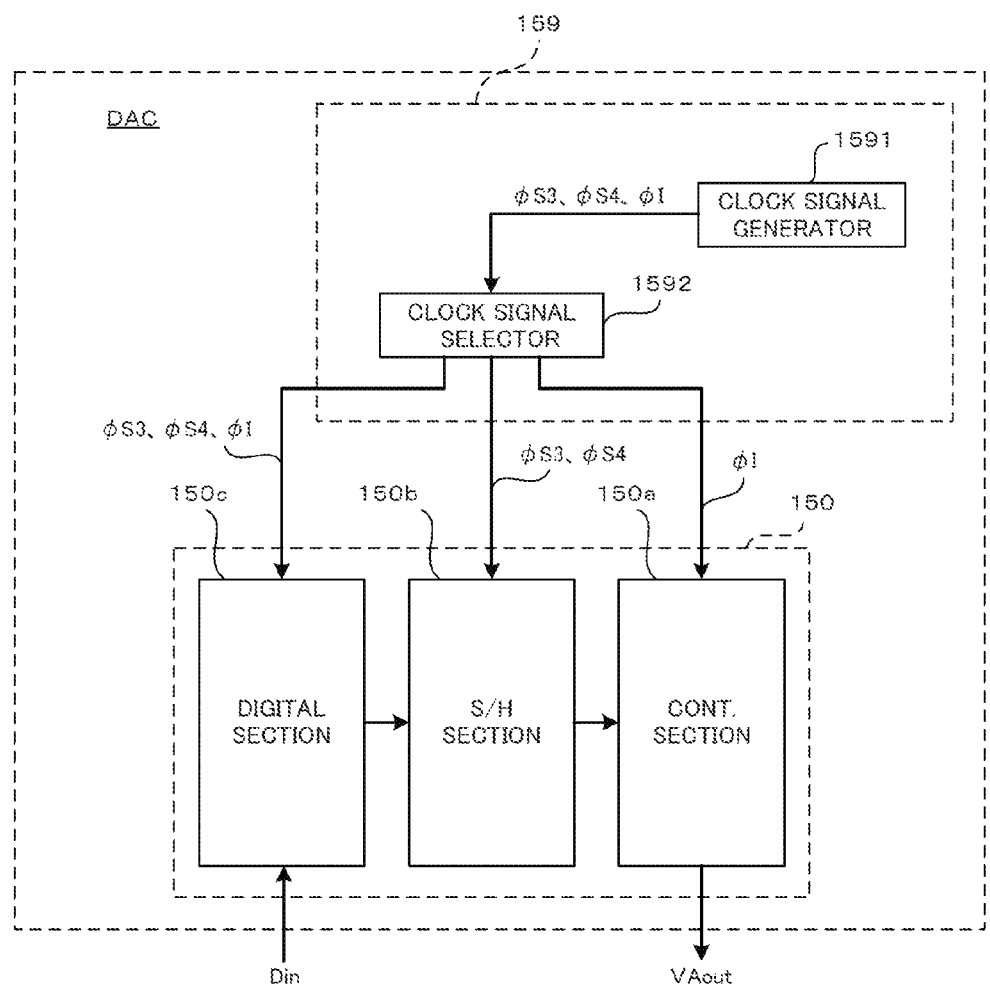
FIG. 20 is a functional block diagram of the D/A converter according to Embodiment 1-1 of the present invention.

FIG. 20 is a functional block diagram of the D/A converter (DAC) according to Embodiment 1-1.

As shown in FIG. 20, the D/A converter according to Embodiment 1-1 includes a sampling circuit 150 including the digital section (which is described as a digital section in the drawing) 150c, the sampling and holding section (which is described as a S/H section in the drawing) 150b, and the continuous section (which is described as a CONT. section in the drawing) 150a and a control circuit 159.

The control circuit 159 includes a clock signal generator 1591 that generates the clock signals φS3, φS4, and φI and a clock signal selector 1592 that selects the clock signals φS3 and φS4 out of the clock signals φS3, φS4, and φI generated by the clock signal generator 1591 and outputs the selected clock signals to the sampling and holding section 150b and that selects and outputs the clock signal φI to the continuous section 150a.

According to Embodiment 1-1, the sampling and holding section 150b transmits the sampled signal to the continuous section 150a. The signal component to be transmitted is a DC component. Accordingly, even when the sampling and holding section 150b has plural operation clocks, the signal component is not attenuated by averaging. However, periodic noise generated from the D/A converter itself or periodic noise mixed from another electronic device is an AC component. Accordingly, since the sampling and holding section 150b has plural operation clocks, the component of periodic noise is attenuated by averaging. As a result, the D/A converter according to Embodiment 1-1 exhibits a periodic noise suppressing effect. In other words, it can be said in Embodiment 1-1 that an attenuation coefficient based on the averaging can be multiplied by only an NTF (Noise Transfer Function) without changing an STF (Signal Transfer Function).

In Embodiment 1-1, periodic noise mixed into the output signal of the D/A converter can be efficiently separated from the signal component. Accordingly, in Embodiment 1-1, it is possible to average only noise in the in-band and thus to reduce the spectrum thereof without adding noise to a signal to be transmitted.

In Embodiment 1-1, it is possible to reduce noise generated from devices around the D/A converter and also to enhance resistance to noise of the D/A converter itself. Accordingly, it is possible to reduce the influence of noise on the D/A converter by changing only the D/A converter without changing the configuration of other devices around the D/A converter.

Embodiment 1-1 may be realized only by adding a circuit that generates plural clock signals. Accordingly, advanced semiconductor process technology or an increase in the number of pins of a chip becomes unnecessary and it is thus possible to prevent an increase in the cost of the D/A converter. According to Embodiment 1-1, since the D/A converter can be disposed to be sufficiently close to other devices without considering the influence of noise, it is possible to achieve a decrease in the size of a device including the D/A converter.

In Embodiment 1-1, it is possible to reduce a noise suppressing request to a decoupling capacitor which is generally installed for the purpose of reducing noise generated from devices around the D/A converter. In this case, when a satisfactory effect of noise reduction is achieved, it may be possible to make the decoupling capacitor unnecessary.

In Embodiment 1-1, when the D/A converter is used as a simple component, the control circuit 159 shown in FIG. 19 is provided to correspond to a single sampling circuit. In Embodiment 1-1, the control circuit 159 of the D/A converter may be disposed outside the D/A converter. In Embodiment 1-1, when the sampling circuit of the D/A converter shown in FIG. 1 is constructed as an independent device, the control circuit 159 may be disposed outside the device.

The clock signal selector 1592 may select and output one of the clock signal φS3, φS4, and φI to the digital section 150c. The digital section 150c is driven by the selected clock signal.

Embodiment 1-1 is not limited to the configuration in which the sampling and holding section 150b is driven by two clock signal φS3 and φS4, and more (natural number N) switches may be driven by N clock signals. In this case, each of the N clock signals have only to be delayed by a delay time T (for example, 10 ns).

Embodiment 1-2 will be described below.

Figure 21:
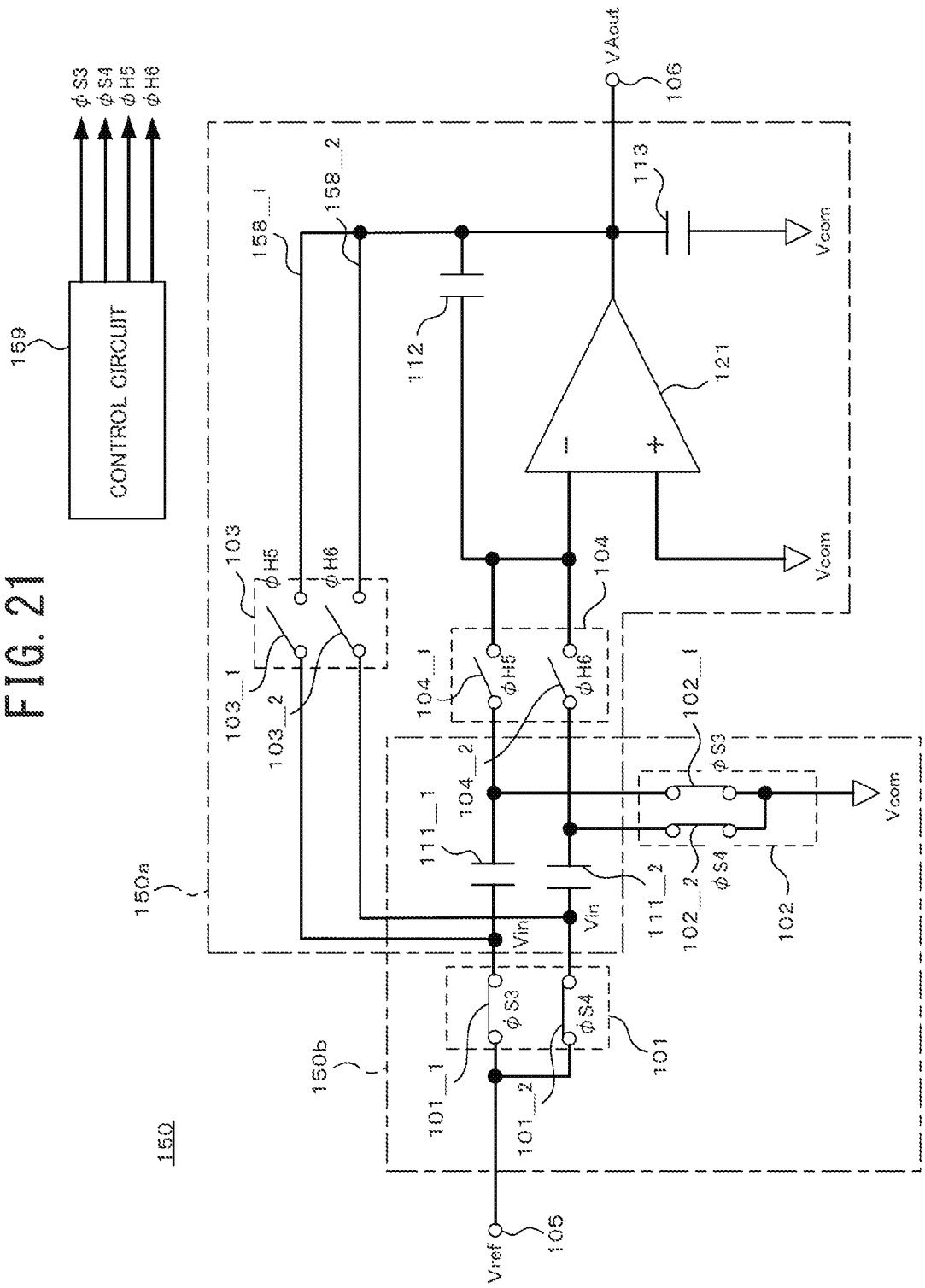
FIG. 21 is a diagram illustrating a D/A converter according to Embodiment 1-2 of the present invention.

FIG. 21 is a diagram illustrating a D/A converter according to Embodiment 1-2, which includes a sampling circuit 150 shown in FIG. 21 and a control circuit 159 that outputs the clock signals φS3, φS4, φH5, and φH6 for driving the sampling circuit 150.

In FIG. 21, the same elements as shown in FIG. 19 will be referenced by the same reference numerals and partial description thereof will not be repeated.

The sampling circuit 150 includes the digital section not shown, the continuous section 150a, and the sampling and holding section 150b as shown in FIG. 19. The continuous section 150a includes switches 103_1 and 103_2 and switches 104_1 and 104_2. The sampling and holding section 150b includes switches 101_1 and 101_2 and switches 102_1 and 102_2.

The control circuit 159 generates and outputs the clock signals φS3, φS4, φH5, and φH6. The clock signal φS3 is input to the switches 101_1 and 101_2 of the sampling and holding section 150b. The clock signal φS4 is input to the switches 101_1 and 102_2. The clock signal φH5 is input to the switches 103-1 and 104_1 of the continuous section 150a. The clock signal φH6 is input to the switches 103_2 and 104_2 of the continuous section 150a.

Figure 22:
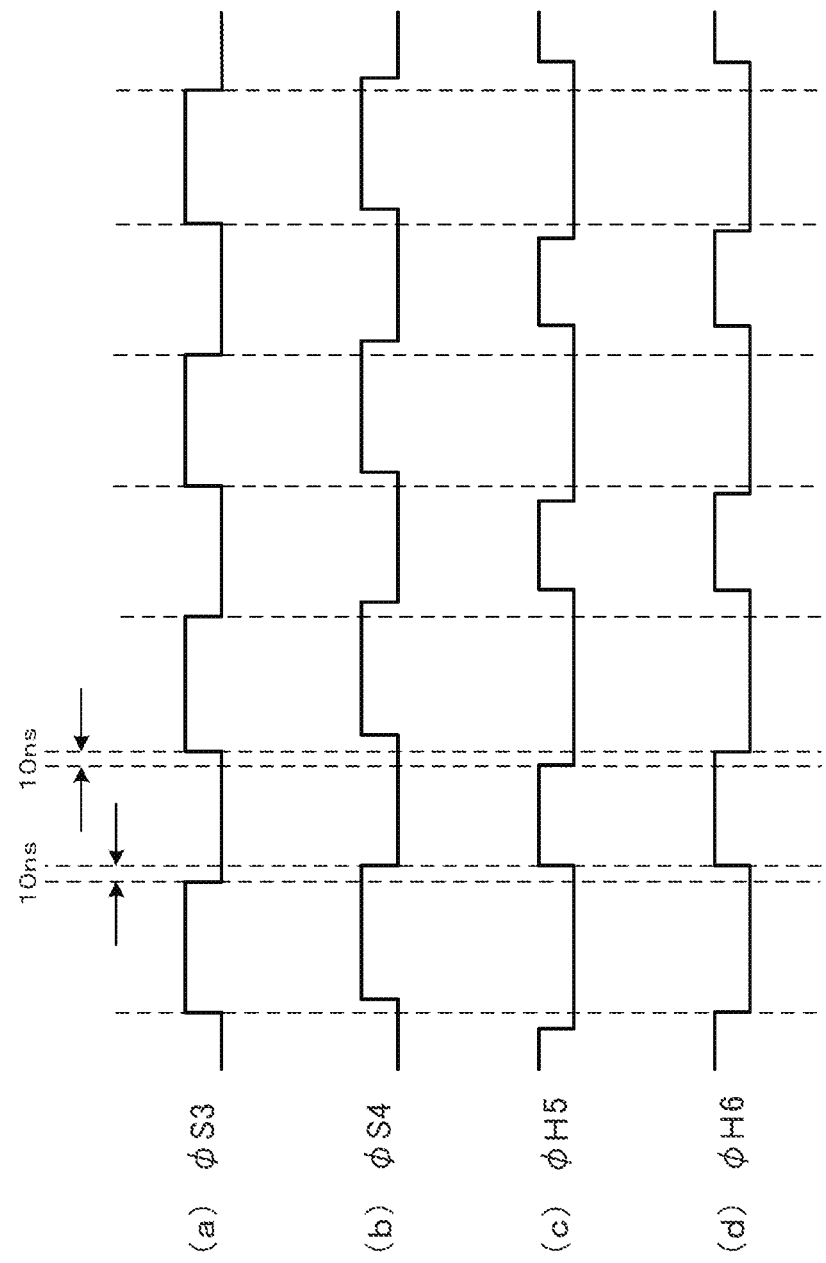
FIGS. 22(a)-(d) are timing diagrams illustrating timings of clock signals.

(a), (b), (c), and (d) of FIG. 22 are diagrams illustrating the clock signals output from the control circuit 159.

(a) Of FIG. 22 shows a timing chart of the clock signal φS3, (b) of FIG. 22 shows a timing chart of the clock signal φS4, (c) of FIG. 22 shows a timing chart of the clock signal φH5, and (d) of FIG. 22 shows a timing chart of the clock signal φH6.

The clock signals φS3, φS4, φH5, and φH6 drive the switches so that the switches are turned on at the high level and the switches are turned off at the low level.

As shown in (a) and (b) of FIG. 22, the clock signal φS4 is a clock signal delayed from the clock signal φS3. In Embodiment 1-2, the delay time T of the clock signal φS4 from the clock signal φS3 is set to 10 ns. As shown in (c) and (d) of FIG. 22, the clock signal φH6 is a clock signal that rises at the same time as the clock signal φH5 and that falls with a delay therefrom. In Embodiment 1-2, the delay time T of the clock signal φH6 from the clock signal φH5 is set to 10 ns. The clock signal φS3 and φS4, and the clock signals φH5 and φH6 are reverse-phased and non-overlapping clock signals which are not changed to the high level at the same time as any thereof.

In Embodiment 1-2, the delay time T of the clock signal is not limited to 10 ns. The delay time T can be arbitrarily set depending on the operation timing of the sampling and holding section 150b or the clock of the input reference signal $V_{ref}$.

In Embodiment 1-2, a part indicating the rising of a clock signal is referred to as a rising edge. The rising edge is a trigger for determining an operation start time of a switch operating in response to the clock signal. In Embodiment 1-2, a part indicating the falling of a clock signal is referred to as a falling edge. The falling edge is a trigger for determining an operation end time of a switch operating in response to the clock signal.

The clock signal φH6 that rises at the same time as the clock signal φH5 and that falls with a delay therefrom is generated, for example, by inputting the clock signal φH5 and the clock signal with a delay from the clock signal φH5 to an OR circuit.

Figure 23:
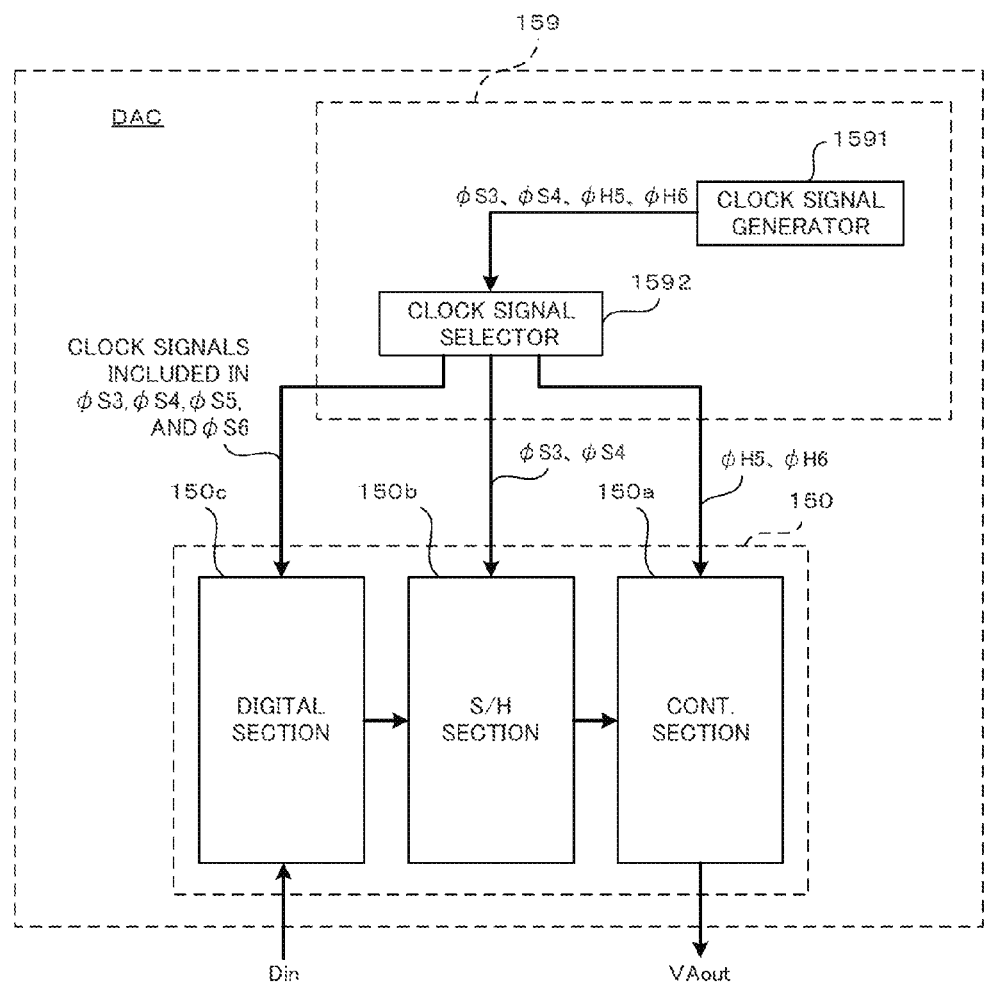
FIG. 23 is a functional block diagram of the D/A converter according to Embodiment 1-2 of the present invention.

FIG. 23 is a functional block diagram of the D/A converter (DAC) according to Embodiment 1-2 shown in FIG. 21.

As shown in FIG. 23, the D/A converter according to Embodiment 1-2 includes a sampling circuit 150 including the digital section (which is described as a digital section in the drawing) 150c, the sampling and holding section (which is described as a S/H section in the drawing) 150b, and the continuous section (which is described as a Cont. section in the drawing) 150a and a control circuit 159.

The control circuit 159 includes a clock signal generator 1591 that generates the clock signals φS3, φS4, φH5, and φH6 and a clock signal selector 1592 that selects the clock signals φS3 and φS4 out of the clock signals φS3, φS4, φH5, and φH6 generated by the clock signal generator 1591 and outputs the selected clock signals to the sampling and holding section 150b and that selects and outputs the clock signals φH5 and φH6 to the continuous section 150a. The clock signal selector 1592 may select any of the clock signals φS3, φS4, φH5, and φH6 and output the selected clock signal to the digital section 150c. In this case, the digital section 150c is driven by the output clock signal.

According to Embodiment 1-2, the sampling and holding section 150b transmits the sampled signal to the continuous section 150a. The signal component to be transmitted is a DC component. Accordingly, even when the sampling and holding section 150b has plural operation clocks, the signal component is not attenuated by averaging. However, periodic noise generated from the D/A converter itself or periodic noise mixed from another electronic device is an AC component. Accordingly, since the sampling and holding section 150b has plural operation clocks, the component of periodic noise is attenuated by averaging.

The continuous section 150a outputs the signal transmitted from the sampling and holding section 150b as an analog output signal $A_{out}$. As described above, the continuous section 150*a* operates in response to the clock signals φH5 and φH6. The φH5 and φH6 rise at the same timing and fall at different timings. That is, the continuous section 150*a* has plural operation clocks only at the operation end time. Accordingly, in Embodiment 1-2, a signal component is not attenuated by the averaging, but periodic noise generated from the D/A converter itself or periodic noise mixed from another electronic device is attenuated by the averaging.

As a result, the D/A converter according to Embodiment 1-2 exhibits a periodic noise suppressing effect. In other words, it can be said in Embodiment 1-2 that an attenuation coefficient based on the averaging can be multiplied by only the NTF without changing the STF.

In Embodiment 1-2, periodic noise mixed into the output signal of the D/A converter can be efficiently separated from the signal component. Accordingly, in Embodiment 1-2, it is possible to average only noise in the in-band and thus to reduce the spectrum thereof without adding noise to a signal to be transmitted.

In Embodiment 1-2, it is possible to reduce noise generated from devices around the D/A converter and also to enhance resistance to noise of the D/A converter itself. Accordingly, it is possible to reduce the influence of noise on the D/A converter by changing only the D/A converter without changing the configuration of other devices around the D/A converter.

Embodiment 1-2 may be realized only by adding a circuit that generates plural clock signals. Accordingly, advanced semiconductor process technology or an increase in the number of pins of a chip becomes unnecessary and it is thus possible to prevent an increase in the cost of the D/A converter. According to Embodiment 1-2, since the D/A converter can be disposed to be sufficiently close to other devices without considering the influence of noise, it is possible to achieve a decrease in the size of a device including the D/A converter.

In Embodiment 1-2, it is possible to reduce a noise suppressing request to a decoupling capacitor which is generally installed for the purpose of reducing noise generated from devices around the D/A converter. In this case, when a satisfactory effect of noise reduction is achieved, it may be possible to make the decoupling capacitor unnecessary.

In Embodiment 1-2, when D/A converter is used as a simple, the control circuit 159 shown in FIG. 21 is provided to correspond to a single sampling circuit. In Embodiment 1-2, the control circuit 159 of the D/A converter may be disposed outside the D/A converter. In Embodiment 1-2, when the sampling circuit of the D/A converter shown in FIG. 21 is constructed as an independent device, the control circuit 159 may be disposed outside the device.

The continuous section 150*a* of the sampling circuit according to Embodiment 1-2 starts outputting the signal transmitted by the sampling and holding section 150*b* as an analog output signal $A_{out}$ at the operation start time. At the operation end time, the analog output signal $A_{out}$ output at the operation end time is sampled and held up to the next operation start. At this time, when periodic noise is superimposed in sampling and holding at the operation end time, the sampling circuit shown in FIG. 1 replicates the noise of the analog output signal $A_{out}$.

Embodiment 1-2 has been made to reduce noise mixed in the continuous section by spread.

That is, in the sampling circuit according to the first aspect shown in FIG. 1, periodic noise added from the D/A converter itself or other electronic devices is replicated in the operation of sampling and holding a signal in the continuous section. On the other hand, in Embodiment 1-2, the clock signals in which triggers for determining the operation start time of the switching elements are generated at the same timing and triggers for determining the operation end time of the switching elements are generated at different timings are supplied and the continuous section operates in response to the supplied clock signals.

Accordingly, since the continuous section has plural triggers for determining the operation end time similarly to the sampling and holding section, the filtering effect of the FIR filter is exhibited at the time of replication and the periodic noise is suppressed. Since the triggers for determining the operation start time is the same for plural switches, the signal component of the analog output signal $A_{out}$ is not attenuated and only the periodic noise can be suppressed.

Embodiment 1-2 is not limited to the configuration in which the sampling and holding section 150*b* is driven by two clock signal φS3 and φS4, and more (natural number N) switches may be driven by N clock signals depending on the number of charge-accumulating capacitors. In this case, each of the N clock signals has only to be delayed by a delay time T (for example, 10 ns).

In this case, N switch units 103 have only to be installed depending on the number of charge-accumulating capacitors. In this case, the falling timings of the N clock signals for driving the switch units 103 can be delayed by a delay time T from the clock signal φH6.

Embodiment 2 of the present invention will be described below.

Embodiment 2 relates to an A/D converter employing the sampling circuit according to the present invention. In Embodiment 2, an example where the A/D converter is constructed as a pipeline type A/D converter will be described.

Figure 24:
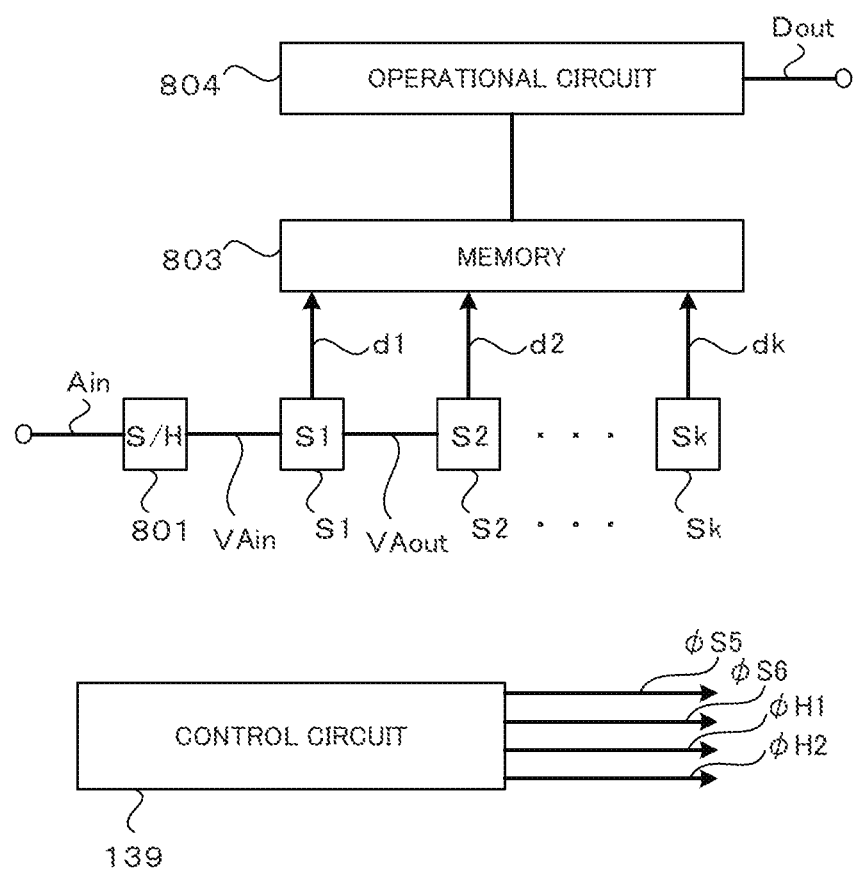
FIG. 24 is a diagram illustrating the entire configuration of a pipeline type A/D converter according to Embodiment 2 of the present invention.

FIG. 24 is a diagram illustrating the entire configuration of the pipeline type A/D converter according to Embodiment 2.

The pipeline type A/D converter according to Embodiment 2 is a converter that converts an analog input signal $A_{in}$ into a digital output signal $D_{out}$. Accordingly, the pipeline type A/D converter includes a sampling circuit (which is described as S/H in the drawing) 801 that samples and holds the analog input signal $A_{in}$, k stages S1, S2, ..., Sk that are connected in series to determine each bit, a memory 803 that stores a single-digit digital output signal dj (where j is an integer of 1 to k) determined in each stage, and an operational circuit 804 that calculates the digital output signal $D_{out}$ which is the A/D converted value of the analog input signal $A_{in}$ on the basis of the digital output signals dj stored in the memory 803.

In Embodiment 2, it is assumed that the A/D converter includes a control circuit 139 that controls plural stages. The sampling circuit 801 is the sampling circuit according to Embodiment 2 and the configuration including the sampling circuit 801 and the control circuit 139 is the A/D converter according to Embodiment 2.

The control circuit 139 outputs at least one of clock signals φS5 and φS6 representing the operation clocks of the stages and clock signals φH7 and φH8 that are reverse-phased and non-overlapping clock signals which are not changed to the high level at the same time as the clock signals φS5 and φS6.

(a) to (d) of FIG. 25 show the clock signals φS5 and φS6 and the clock signals φH7 and φH8.

(a) of FIG. 25 shows the clock signal φS5 and (b) of FIG. 25 shows the clock signal φS6. (c) of FIG. 25 shows the clock signal φH7 and (d) of FIG. 25 shows the clock signal φH8.

As can be clearly seen from (a) to (d) of FIG. 25, the clock signal φS6 is delayed from the clock signal φS5, and the clock signal φH8 is delayed from the clock signal φH7. In Embodiment 2, the delay time T of the clock signal φS6 from the clock signal φS5 and the delay time T of the clock signal φH8 from the clock signal φH7 are set to 10 ns.

In Embodiment 2, the sampling circuit 801 operates in response to the clock signals φS5, φS6, φH7, and φH8 of the timings of changing to the high level and the low level are different. The clock signals φS5, φS6, φH7, and φH8 drive the switches so that the switches of the sampling circuit 801 are turned on when the clock signals are at the high level and the switches are turned off when the clock signals are at the low level.

The sampling circuit 801 is a circuit that transmits a value, which is obtained by sampling and holding an analog input signal $A_{in}$, as the analog input signal $V_{Ain}$ to the first stage S1. The sampling circuit 801 employs a non-feedback sampling circuit including analog switches and capacitors.

The stages S1 to Sk are connected in series and transmit single-digit output signals dj to the memory 803 on the basis of the input signal $V_{Ain}$. In each stage, the input signal $V_{Ain}$ is input from the front stage, and an analog output signal $V_{Aout}$ generated by the digital output signal dj and the input signal $V_{Ain}$ is output to the next stage. In the drawing, the input signal $V_{Ain}$ and the output signal $V_{Aout}$ based on the stage S1 are shown.

The memory 803 receives and stores the single-digit digital output signals dj from the k stages S1 to Sk. Accordingly, a semiconductor memory capable of storing at least k 1-bit addresses or the like is used as the memory 803.

The operational circuit 804 performs a calculation on the basis of the digital output signal dj stored in the memory 803 and outputs the L-digit digital output signal $D_{out}$. The calculation for calculating the digital output signal $D_{out}$ is performed as follows.

That is, the operational circuit 804 adds the highest significant position of the digital output dk of the stage Sk and the lowest significant position of the digital output d (k−1) of the stage S (k−1) by a binary method. On the addition result (added value), the highest significant position of d (k−1) and the lowest significant position of the digital output d(k−2) of the stage S(k−2) are similarly added by a binary method.

By repeating this process, the lowest significant position of the digital output d1 of the stage S1 and the highest significant position of the digital output d2 of the stage S2 are added. The final addition result is output as the digital output signal $D_{out}$.

FIG. 26 is a diagram illustrating an example of the calculation of calculating the above-mentioned digital output signal $D_{out}$.

In the example shown in FIG. 26, it is assumed that four stages S1 to S4 are provided and the respective stages S1 to S4 output the three-digit digital outputs d1 to d4 to the memory 803 shown in FIG. 24. More specifically, the values of the digital outputs d1 to d4 are determined as follows.

d1=001, d2=100, d3=101, d4=111

In the example of FIG. 26, the value "010011011" is obtained as the digital output signal $D_{out}$ as the addition result of the highest significant position and the lowest significant position of the digital outputs output from the neighboring stages.

Embodiment 2-1 and Embodiment 2-2 will be described below as specific examples of the sampling circuit according to Embodiment 2.

Figure 27:
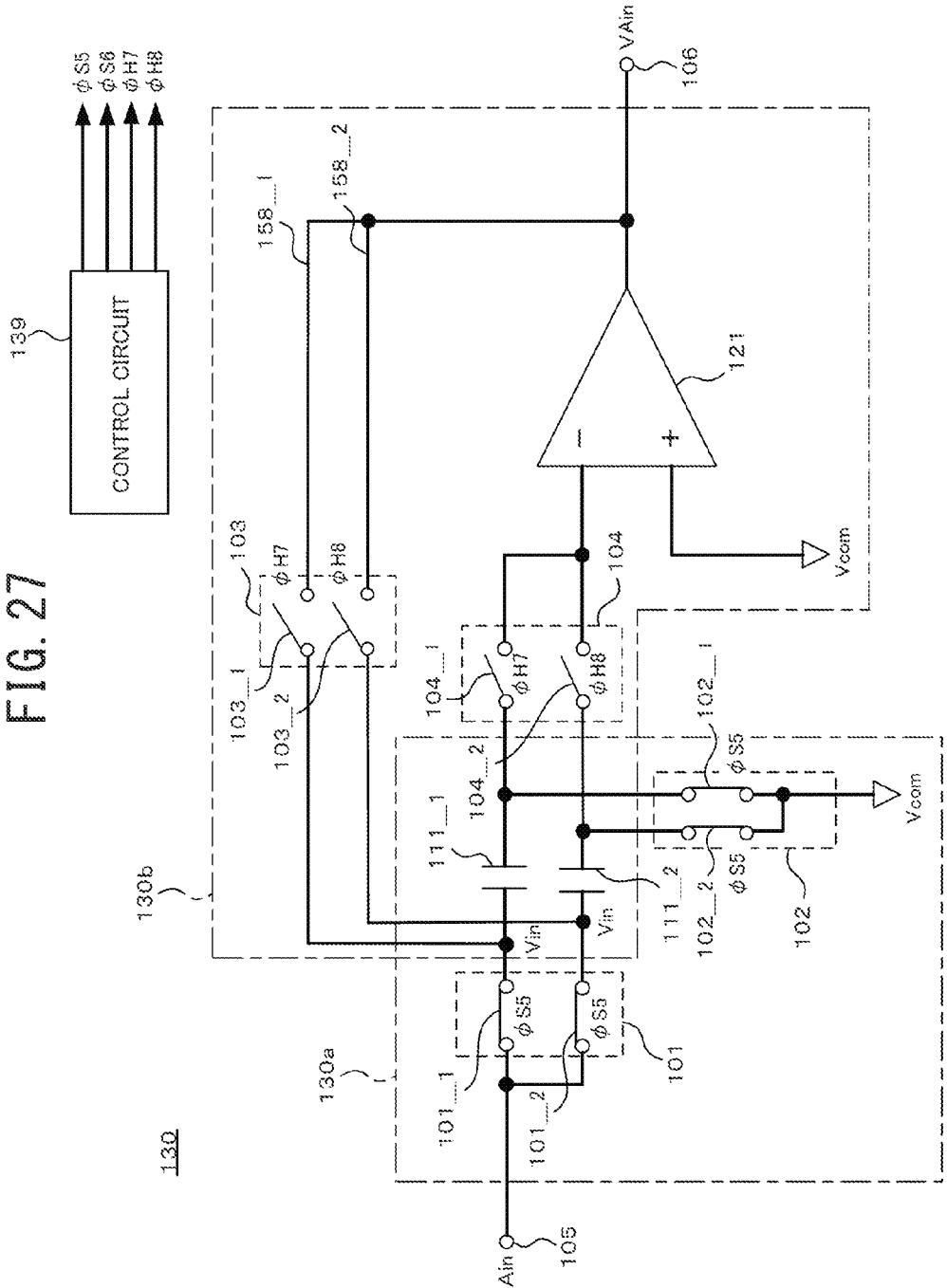
FIG. 27 is a diagram illustrating an A/D converter according to Embodiment 2-1 of the present invention.

FIG. 27 is a diagram illustrating an A/D converter including a sampling circuit 130 and a control circuit 139 according to Embodiment 2-1, where the sampling circuit 130 is used as the sampling circuit 801 shown in FIG. 24.

In FIG. 27, the same elements as shown in FIG. 10 will be referenced by the same reference numerals and partial description thereof will not be repeated.

The sampling circuit 130 includes a continuous section 130a that receives the analog input signal $A_{in}$ and a sampling and holding section 130b that intermittently samples the analog input signal $A_{in}$ input from the continuous section 130a and that holds and transmits the sampled signal.

The control circuit 139 common to the stages of the pipeline type A/D converter generates and outputs the clock signals φS5, φS6, φH7, and φH8. Out of the clock signals, the clock signal φS5 is input to the continuous section 130a and the clock signals φH7 and φH8 are input to the sampling and holding section 130b.

The continuous section 130a includes a switch unit 101 including switches 101_1 and 101_2 and a switch unit 102 including switches 102_1 and 102_2. The switches of the continuous section 130a are all driven in response to the clock signal φS5. By the ON/OFF operations of the switches 101_1 and 101_2 and the switches 102_1 and 102_2, the analog input signal $A_{in}$ becomes the input signal $V_{in}$.

The sampling and holding section 130b includes capacitors 111_1 and 111_2 that sample the input signal $V_{in}$ and hold the charge generated by the input signal $V_{in}$, switches 104_1 and 104_2 that connect the capacitors 111_1 and 111_2 to the inverting input terminal of the operational amplifier 121, and switches 103_1 and 103_2 that transmit the charge held in the capacitors 111_1 and 111_2 to the rear stage. The switches 103_1 and 104_1 perform the switching operation in response to the clock signal φH7. The switches 103_2 and 104-2 perform the switching operation in response to the clock signal φH8.

As described above, in Embodiment 2-1, the switches 103_1 and 103_2 and the switches 104_1 and 104_2 of the sampling and holding section 130b are driven by two clock signals φH7 and φH8. Embodiment 2-1 is not limited to the configuration in which the sampling and holding section 130b is driven by two clock signal, and more (natural number N) switches may be driven by N clock signals. In this case, capacitors 111_1, 111_2, . . . , 111_N are provided. In this case, the capacities of the capacitors 111_1, 111_2, . . . , 111_N are set so that the total capacity of the capacitors 111_1, 111_2, . . . , 111_N is equal to the total capacity of the capacitors 111_1 and 111_2. This configuration can be said to be division of the total capacity of the capacitors 111_1, and 111_2 into any number N. The clock signals for driving the switches of the switch units 103 and 104 of the sampling and holding section 130b are sequentially delayed by a delay time (for example, 10 ns) from the clock signal φH7 depending on the number of switches.

In Embodiment 2-1, an analog FIR filter that lowers the gain of a specific frequency can be formed by appropriately distributing the capacity magnitude and the operation timing of the capacitors of the sampling and holding section 130b.

Figure 28:
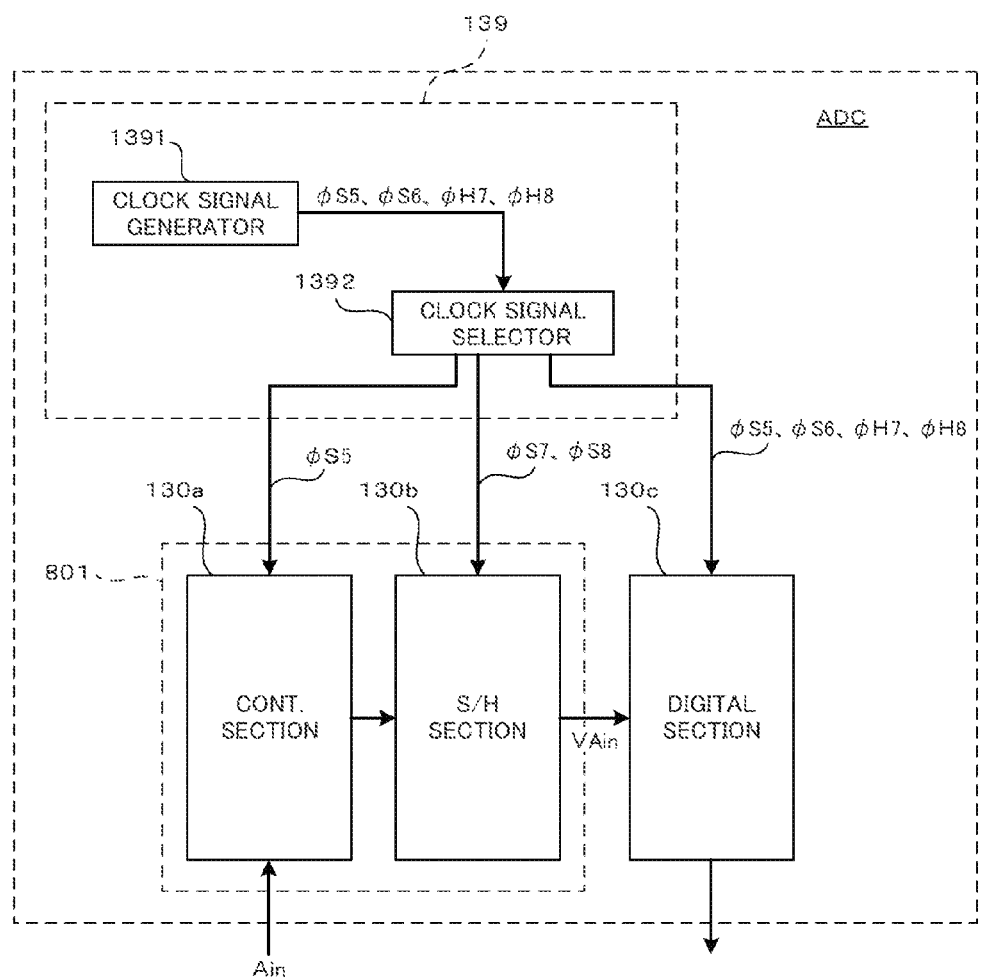
FIG. 28 is a functional block diagram of the A/D converter according to Embodiment 2-1 of the present invention.

FIG. 28 is a functional block diagram of the A/D converter (ADC) according to Embodiment 2-1.

As shown in FIG. 28, the A/D converter according to Embodiment 2-1 includes a sampling circuit 801 including the digital section (which is described as a digital section in the drawing) 130c, the sampling and holding section (which is described as an S/H section in the drawing) 130b, and the continuous section (which is described as a CONT. section in the drawing) 130a and a control circuit 139.

The control circuit 139 includes a clock signal generator 1391 that generates the clock signals φS5, φS6, φH7, and φH8 and a clock signal selector 1392 that selects the clock signals φH7 and φH8 out of the clock signals φS5, φS6, φH7, and φH8 generated by the clock signal generator 1391 and outputs the selected clock signals to the sampling and holding section 130b and that selects and outputs the clock signal φS5 to the continuous section 130a.

According to Embodiment 2-1, the sampling and holding section 130b transmits the sampled signal. The signal $V_{Ain}$ to be output from the sampling circuit 801 is a DC component. Accordingly, even when the sampling and holding section 130b has plural operation clocks, the signal component is not attenuated by averaging. However, periodic noise generated from the A/D converter itself or periodic noise mixed from another electronic device is an AC component. Accordingly, since the sampling and holding section 130b has plural operation clocks, the component of periodic noise is attenuated by averaging. As a result, the A/D converter according to Embodiment 2-1 exhibits a periodic noise suppressing effect. In other words, it can be said in Embodiment 2-1 that an attenuation coefficient due to the averaging can be multiplied by only the NTF without changing the STF.

In Embodiment 2-1, periodic noise mixed into the output signal of the A/D converter can be efficiently separated from the signal component. Accordingly, in Embodiment 2-1, it is possible to average only noise in the in-band and thus to reduce the spectrum thereof without adding noise to a signal to be transmitted.

In Embodiment 2-1, it is possible to reduce noise generated from devices around the A/D converter and also to enhance resistance to noise of the A/D converter itself. Accordingly, it is possible to reduce the influence of noise on the A/D converter by changing only the A/D converter without changing the configuration of other devices around the A/D converter.

Embodiment 2-1 may be realized only by adding a circuit that generates plural clock signals. Accordingly, advanced semiconductor process technology or an increase in the number of pins of a chip becomes unnecessary and it is thus possible to prevent an increase in cost of the A/D converter. According to Embodiment 2-1, since the A/D converter can be disposed to be sufficiently close to other devices without considering the influence of noise, it is possible to achieve a decrease in the size of a device including the A/D converter.

In Embodiment 2-1, it is possible to reduce a noise suppressing request to a decoupling capacitor which is generally installed for the purpose of reducing noise generated from devices around the A/D converter. In this case, when a satisfactory effect of noise reduction is achieved, it may be possible to make the decoupling capacitor unnecessary.

In Embodiment 2-1, when the A/D converter is used as a simple, the control circuit 139 shown in FIGS. 24 and 27 is provided to correspond to a single sampling circuit. In Embodiment 2, the control circuit 139 of the A/D converter may be disposed outside the D/A converter. In Embodiment 2-1, when the sampling circuit 801 of the A/D converter is constructed as an independent device, the control circuit 139 may be disposed outside the device.

The clock signal selector 1392 may select and output one of the clock signals φS5, φS6, φH7, and φH8 to the digital section 130c. The digital section 130c is driven by the selected clock signal.

A sampling circuit and an A/D converter using the sampling circuit according to Embodiment 2-2 will be described below.

Embodiment 2-2 is different from Embodiment 2-1, in that since radiation noise due to inrush current in the continuous section is spread, the continuous section is caused to operation on the basis of first clock signals two or more operation timings of which the rising timings are different and the falling timings are the same. In this embodiment, a part indicating the rising of a clock signal is referred to as a rising edge. The rising edge is a trigger for determining an operation start time of a switch operating in response to the clock signal. In this embodiment, a part indicating the falling of a clock signal is referred to as a falling edge. The falling edge is a trigger for determining an operation end time of a switch operating in response to the clock signal.

By providing a clock signal with plural edges, it is possible to more effectively spread the radiation noise due to inrush current in the analog section and to further reduce the peak of the spectrum of the periodic noise N3 shown in (a) of FIG. 18. Since the edges which are the triggers for determining the operation start/end times are identical to each other, the signal component of the analog input signal $V_{in}$ is not multiplied by the attenuation coefficient and thus only the periodic noise can be suppressed.

In Embodiment 2-2, an example where the A/D converter is constructed by a pipeline type A/D converter will be described.

The entire configuration of the pipeline type A/D converter according to this embodiment is the same as shown in FIG. 24.

Figure 29:
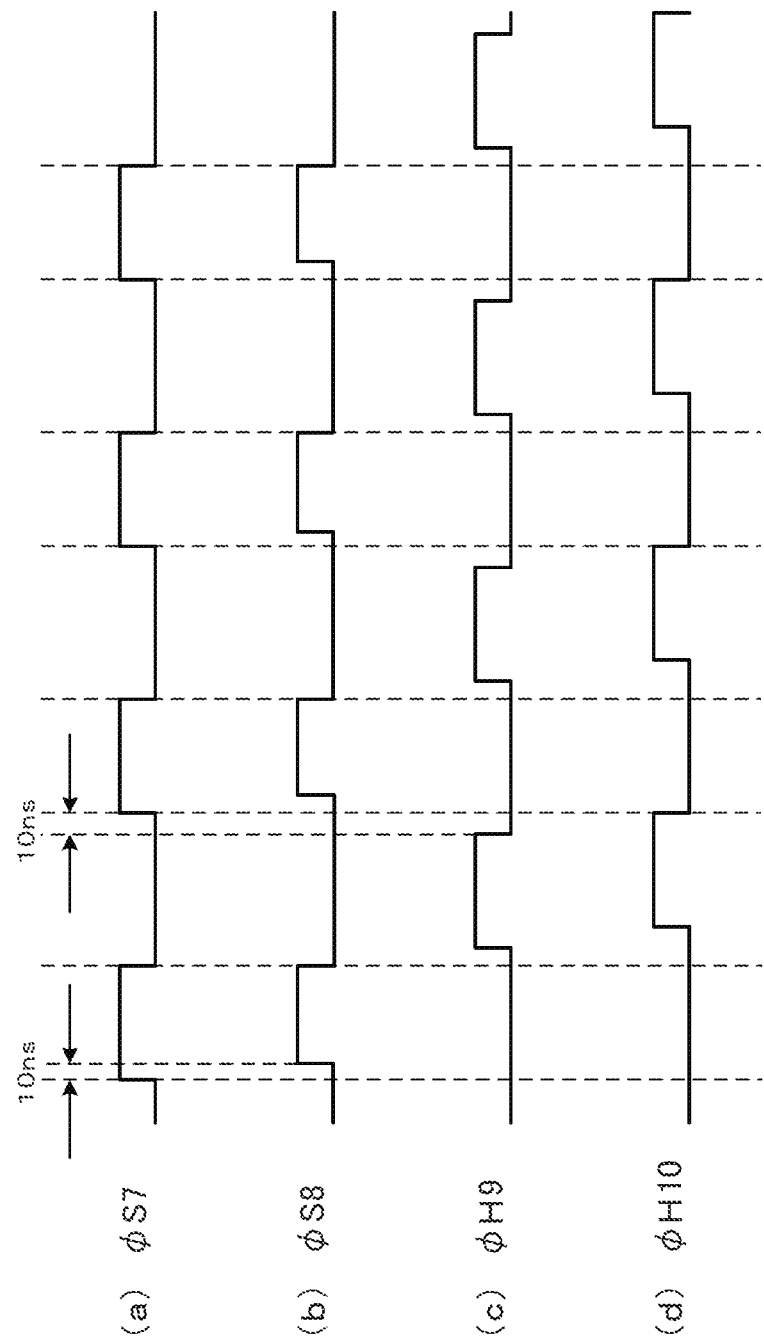
FIGS. 29(a)-(d) are diagrams illustrating clock signals in Embodiment 2-2 of the present invention.

(a) to (d) of FIG. 29 show the clock signals φS7 and φS8 and the clock signals φH9 and φH10.

(a) of FIG. 29 shows the clock signal φS7 and (b) of FIG. 29 shows the clock signal φS8.

(c) of FIG. 29 shows the clock signal φH9 and (d) of FIG. 29 shows the clock signal φH10.

As can be clearly seen from (a) to (d) of FIG. 29, the clock signal φS8 is a clock signal of which the rising edge as a trigger for determining the operation start time is delayed from the clock signal φS7 and the falling edge as a trigger for determining the operation end time is the same as the clock signal φS7.

The clock signal φH10 is a clock signal of which the rising edge and the falling edge are delayed from the clock signal φH9. The clock signal φS8 can be generated, for example, by inputting the clock signal φS7 and a clock signal delayed from the clock signal φS7 to an AND circuit. That is, the AND circuit outputs a high signal when both the clock signal φS7 and the clock signal delayed from the clock signal φS7 are at the high level. Accordingly, the clock signal φS8 is generated of which only the rising edge is delayed.

In Embodiment 2-2, the delay time T of the clock signal φS8 from the clock signal φS7 and the delay time T of the clock signal φH10 from the clock signal φH9 are set to 10 ns. The delay time T of the clock signals φS7, φS8, φH9, and φH10 in this embodiment is not limited to 10 ns and can be set arbitrarily. The clock signals φS7 and φS8 are reverse-phased and non-overlapping clock signal which are not changed to the high level at the same time as the clock signals φH9 and φH10.

In Embodiment 2-2, the sampling circuit 801 operates in response to the clock signals φS7, φS8, φH9, and φH10 of the timings of changing to the high level and the low level are different. The clock signals φS7, φS8, φH9, and φH10 drive the switches so that the switches of the sampling circuit 801 are turned on when the clock signals are at the high level and the switches are turned off when the clock signals are at the low level.

Figure 30:
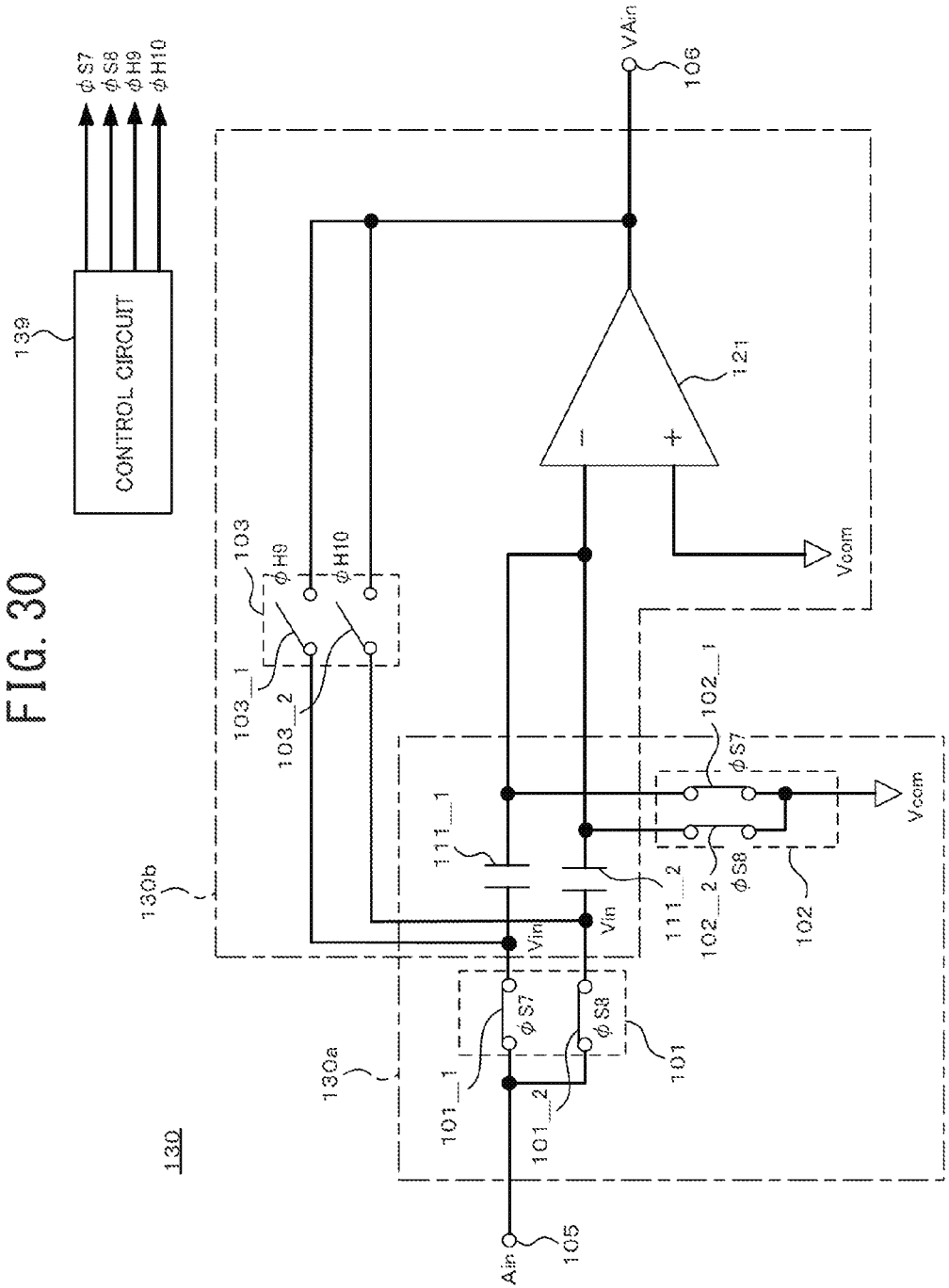
FIG. 30 is a diagram illustrating an A/D converter according to Embodiment 2-2 of the present invention.

FIG. 30 is a diagram illustrating an A/D converter including a sampling circuit 130 and a control circuit 139 according to Embodiment 2-2, where the sampling circuit 130 is used as the sampling circuit 801 shown in FIG. 24.

In FIG. 30, the digital section of the sampling circuit 130 is not shown. In FIG. 30, the same elements as shown in FIG. 27 will be referenced by the same reference numerals and partial description thereof will not be repeated.

The sampling circuit 130 includes a continuous section 130a that receives the analog input signal $A_{in}$ and a sampling and holding section 130b that intermittently samples the analog input signal $A_{in}$ input from the continuous section 130a and that holds and transmits the sampled signal. In Embodiment 2-2, the memory 803 and the operational circuit 804 shown in FIG. 24 serve as the digital section 130c to be described later.

The control circuit 139 common to the stages of the pipeline type A/D converter generates and outputs the clock signals φS7, φS8, φH9, and φH10. Out of the clock signals, the clock signals φS7 and φS8 are input to the continuous section 130a and the clock signals φH9 and φH10 are input to the sampling and holding section 130b. The continuous section 130a includes a switch unit 101 including switches 101_1 and 101_2 and a switch unit 102 including switches 102_1 and 102_2.

In Embodiment 2-2, two switches included in each of the switch units 101 and 102 perform the ON/OFF operation in response to different clock signals. That is, in the switch unit 101 shown in FIG. 30, the switch 101_1 performs the ON/OFF operation in response to the clock signal φS7. On the other hand, the switch 102_1 performs the switching operation in response to the clock signal φS8 of which only the rising edge is delayed from the clock signal φS7. In the switch unit 102, the switch 102_1 performs the ON/OFF operation in response to the clock signal φS7. On the other hand, the switch 102_2 performs the switching operation in response to the clock signal φS8 of which only the rising edge is delayed from the clock signal φS7.

In Embodiment 2-2, by the ON/OFF operations of the switches 101_1 and 101_2 and the switches 102_1 and 102_2, the analog input signal $A_{in}$ becomes the input signal $V_{in}$.

The sampling and holding section 130b includes capacitors 111_1 and 111_2 that sample the input signal $V_{in}$ and hold the charge generated by the input signal $V_{in}$ and switches 103_1 and 103_2 that transmit the charge held in the capacitors 111_1 and 111_2 to the rear stage. The switch 103_1 performs the switching operation in response to the clock signal φH9. The switch 103_2 performs the switching operation in response to the clock signal φH10 of which the rising and falling edges are delayed from the clock signal φH9.

As described above, in Embodiment 2-2, the switches 101_1 and 101_2 and the switches 102_1 and 102_2 of the continuous section 130a are driven by two clock signals φS7 and φS8 having different rising timings. Embodiment 2-2 is not limited to the configuration in which the continuous section 130a is driven by two clock signal, and more (natural number N) switches may be driven by N clock signals. In this case, capacitors 111_1, 111_2, ..., 111_N are provided to the continuous section 130a. In this case, the capacities of the capacitors 111_1, 111_2, ..., 111_N are set so that the total capacity of the capacitors 111_1, 111_2, ..., 111_N is equal to the total capacity of the capacitors 111_1 and 111_2. This configuration can be said to be division of the total capacity of the capacitors 111_1, and 111_2 into any number N.

In the clock signals for driving the switches of the switch units 101 and 102 of the continuous section 130a, the rising timings are sequentially delayed by a delay time (for example, 10 ns) from the rising timing of the clock signal φS7 depending on the number of switches.

Figure 31:
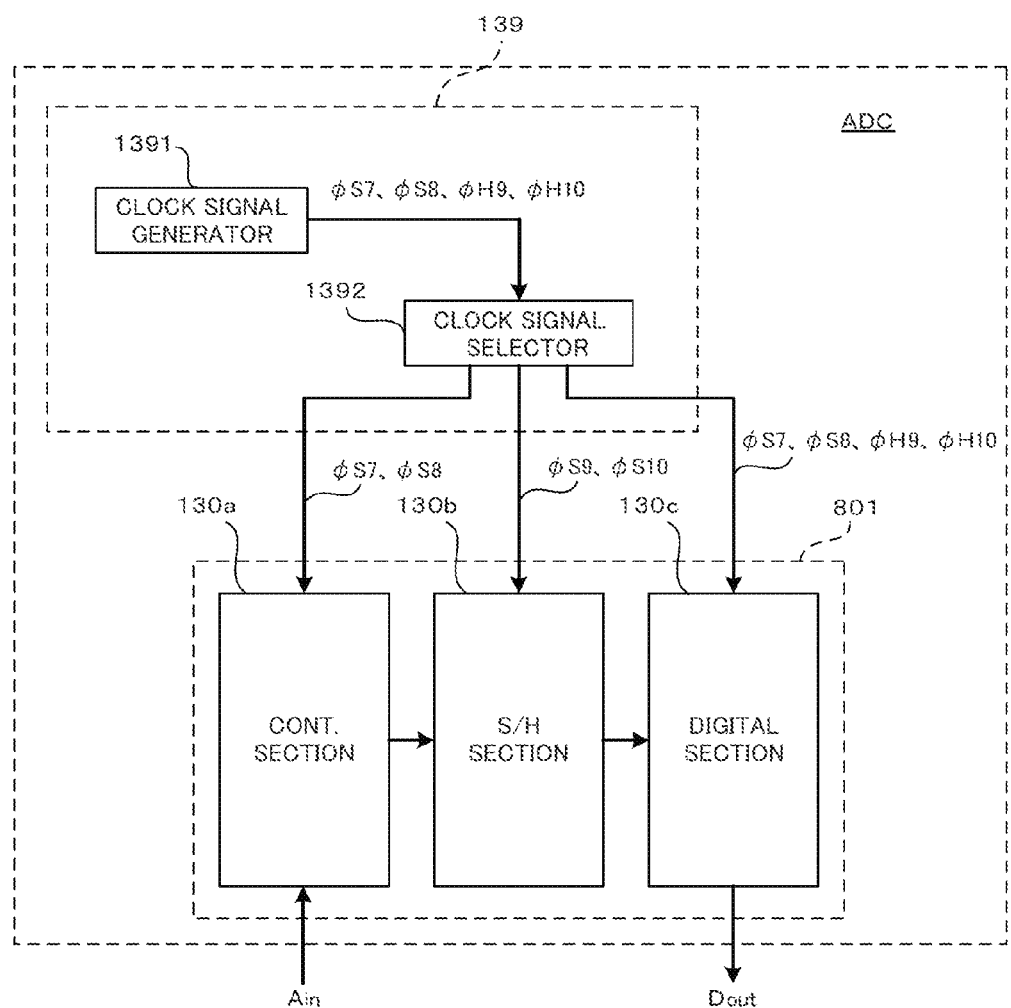
FIG. 31 is a functional block diagram of the A/D converter according to Embodiment 2-2 of the present invention.

FIG. 31 is a functional block diagram of the A/D converter (ADC) according to Embodiment 2-2.

As shown in FIG. 31, the A/D converter according to Embodiment 2-2 includes a sampling circuit 801 including the digital section (which is described as a digital section in the drawing) 130c, the sampling and holding section (which is described as an S/H section in the drawing) 130b, and the continuous section (which is described as a Cont. section in the drawing) 130a and a control circuit 139.

The control circuit 139 includes a clock signal generator 1391 that generates the clock signals φS7, φS8, φH9, and φH10 and a clock signal selector 1392 that selects the clock signals φH9 and φH10 out of the clock signals φS7, φS8, φH9, and φH10 generated by the clock signal generator 1391 and outputs the selected clock signals to the sampling and holding section 130b and that selects and outputs the clock signals φS7 and φS8 to the continuous section 130a.

According to Embodiment 2-2, since the input signal component in the sampling operation of the continuous section 130a is an AC component, the attenuation of the signal component by averaging does not occur by causing the continuous section to operate in response to operation clocks of which the edges which are a trigger for determining the operation end time are the same. On the other hand, by causing the continuous section to operate in response to the operation clocks having plural edges which are a trigger for determining the operation start, it is possible to more effectively suppress radiation noise due to inrush current generated at the time of starting the sampling operation of the continuous section.

According to Embodiment 2-2, it is possible to reduce noise generated from the A/D converter itself to enhance resistance to noise of the A/D converter itself and it is possible to spread radiation noise due to inrush current generated in the continuous section to further reduce noise. Accordingly, it is possible to reduce the influence of noise on the A/D converter by changing only the A/D converter without changing the configuration of other devices around the A/D converter. When plural A/D converters are connected in parallel to increase the number of channels or when plural A/D converters are connected in parallel to operate at a high speed by a time interleaving operation, it is possible to reduce intersymbol interference between the A/D converters due to kickback noise generated from the individual A/D converters adjacent to each other.

Embodiment 2-2 may be realized only by adding a circuit that generates plural clock signals. Accordingly, advanced semiconductor process technology or an increase in the number of pins of a chip becomes unnecessary and it is thus possible to prevent an increase in cost of the A/D converter. According to Embodiment 2-2, since the A/D converter can be disposed to be sufficiently close to other devices without considering the influence of noise, it is possible to achieve a decrease in the size of a device including the A/D converter.

In Embodiment 2-2, it is possible to reduce a noise suppressing request to a decoupling capacitor which is generally installed for the purpose of reducing noise generated from devices around the A/D converter. In this case, when a satisfactory effect of noise reduction is achieved, it may be possible to make the decoupling capacitor unnecessary.

In Embodiment 2-2, when the A/D converter is used as a simple, the control circuit 139 shown in FIGS. 24, 30, and 31 is provided to correspond to a single sampling circuit. In Embodiment 2-2, the control circuit 139 of the A/D converter may be disposed outside the D/A converter. In Embodiment 2-2, when the sampling circuit 801 of the A/D converter is constructed as an independent device, the control circuit 139 may be disposed outside the device.

The clock signal selector 1392 may select and output one of the clock signals φS7, φS8, φH9, and φH10 to the digital section 130c. The digital section 130c is driven by the selected clock signal.

A CODEC according to Embodiment 3 employing the sampling circuit according to the present invention will be described below.

Figure 32:
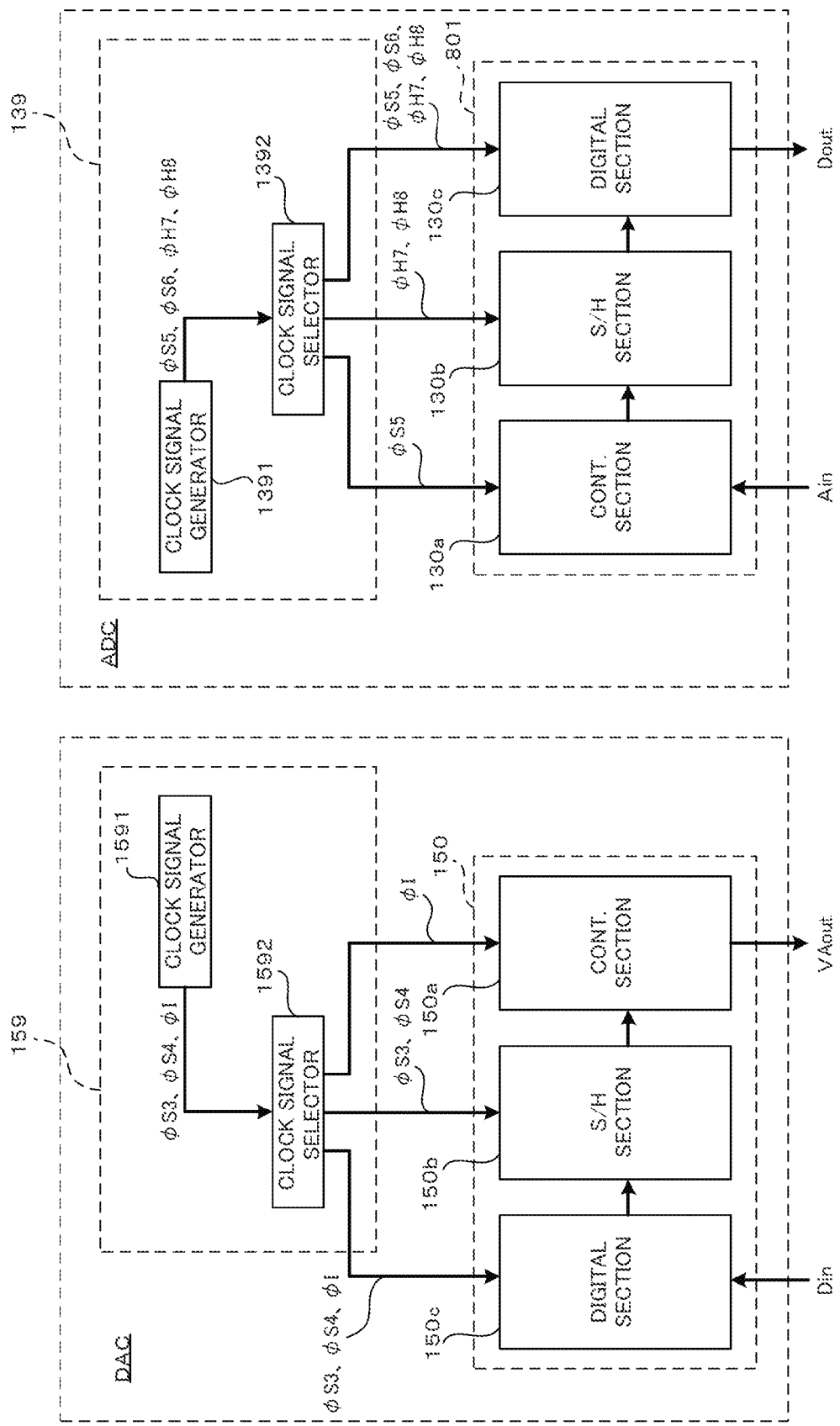
FIG. 32 is a diagram illustrating a CODEC according to Embodiment 3-1 of the present invention.

FIG. 32 is a diagram illustrating Embodiment 3-1. Embodiment 3-1 relates to a CODEC in which the D/A converter according to Embodiment 1-1 and the A/D converter according to Embodiment 2-1 are combined.

In general, when the A/D converter and the D/A converter are combined, it is known that noise generated in the A/D converter and the D/A converter arranged to be close to each other has an influence on each other. However, in both the D/A converter according to Embodiment 1 and the A/D converter according to Embodiment 2, the sampling and holding section are caused to operate in response to plural clock signals having different operation timings. Accordingly, since both the A/D converter and the D/A converter can effectively spread the periodic noise, it is possible to suppress generation of radiation noise itself. Accordingly, in the CODEC according to Embodiment 3, the influence of noise on the D/A converter and the A/D converter from the other party can be reduced.

In the CODEC shown in FIG. 32, distortion of an output signal is smaller than that in the related art, even when the sampling frequencies of the A/D converter and the D/A converter are the same (the operation frequency difference is 0) or even when the sampling frequencies of the A/D converter and the D/A converter have a difference of about ±25 Hz. According to Embodiment 3, distortion of an output signal can be reduced in comparison with the related art, even in an asynchronous CODEC in which the A/D converter and the D/A converter operate in response to different sampling clock signals or even in a synchronous CODEC in which both operate in response to the same sampling clock signal.

The effect of Embodiment 3 is obtained when the sampling and holding section of the A/D converter is caused to operate in response to four different clock signals and the sampling and holding section of the D/A converter is caused to operate in response to four different clock signals.

In the CODEC according to Embodiment 3, it is possible to modulate only the NTF without modulating the STF. Accordingly, it is possible to suppress an influence of radiation noise generated from the A/D converter and the D/A converter on themselves and to suppress an influence of radiation noise generated from the A/D converter and the D/A converter on each other. Accordingly, according to Embodiment 3, it is possible to expect suppression of generation of radiation noise and a synergy effect of noise suppression due to enhancement in resistance to the radiation noise. In the CODEC according to Embodiment 3, the A/D converter and the D/A converter can be arranged to be satisfactorily close to each other without considering noise. Embodiment 3 is advantageous for constructing a small-sized CODEC.

In Embodiment 3, it is possible to reduce a noise suppressing request to a decoupling capacitor which is generally installed for the purpose of reducing noise generated from devices around the A/D converter. In this case, when a satisfactory effect of noise reduction is achieved, it may be possible to make the decoupling capacitor unnecessary.

Figure 33:
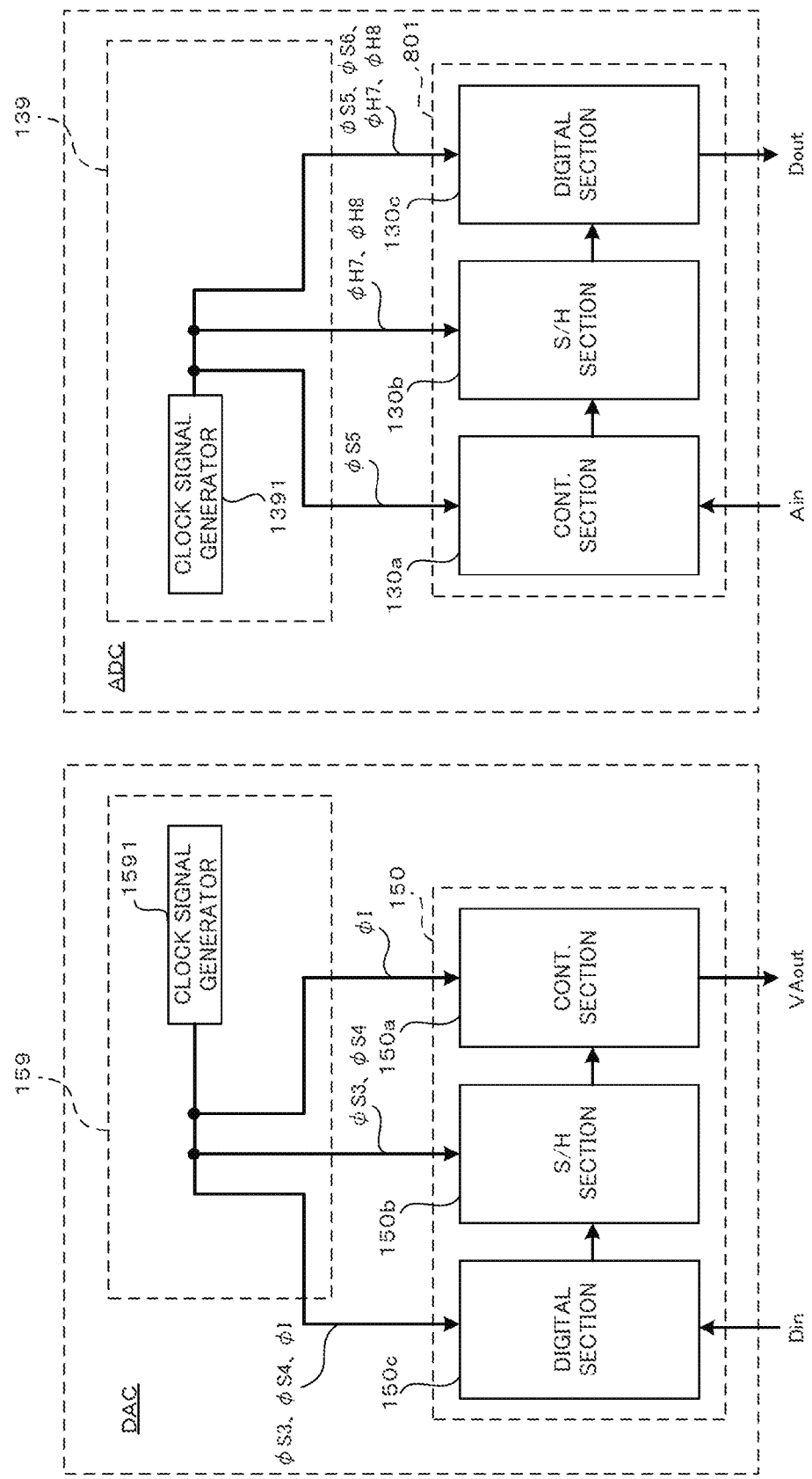
FIG. 33 is a diagram illustrating a CODEC according to Embodiment 3-2 of the present invention.

FIG. 33 is a diagram illustrating a CODEC according to Embodiment 3-2.

This embodiment relates to a CODEC in which the D/A converter according to Embodiment 1 and the A/D converter according to Embodiment 2 are combined, but the clock signal selectors 1392 and 1392 shown in FIG. 32 are removed as shown in FIG. 33. In this embodiment, the same effect as obtained in Embodiment 3-1 is obtained.

The sampling circuit according to the present invention is not limited to the A/D converter, the D/A converter, and the CODEC as described above, but may be used, for example, for a charge pump.

The scope of the present invention is not limited to the illustrated and described exemplary embodiments, but includes all embodiments causing an effect equivalent to the object of the present invention. The scope of the invention is not limited to combinations of features of the inventions defined in the respective claims, but can be defined by all desired combinations of specific features out of all the disclosed features.

INDUSTRIAL APPLICABILITY

The present invention can be used for all electronic devices having a D/A conversion function and an A/D conversion function, in addition to A/D converters, D/A converters, and CODECs.

REFERENCE SIGNS LIST

101, 102, 103, 104: switch unit
101_1, 101_2, 102_1, 102_2, 103_1, 103_2, 104_1, 104_2: switch
105, 106: terminal
111_1, 111_2, 112, 113: capacitor
121: operational amplifier
130a, 150a: continuous section
130b, 150b: sampling and holding section
130c, 150c: digital section
139, 159: control circuit
130, 150, 801: sampling circuit
158_1, 158_2: feedback path
803: memory
804: operational circuit
1391, 1591: clock signal generator
1392, 1392: clock signal selector

The invention claimed is:
1. A sampling circuit comprising:
a continuous section that is a circuit transmitting a continuous signal;
a sampling and holding section that is connected to the continuous section and that is a circuit transmitting a signal which is sampled but not quantized; and
a digital section that is connected to the sampling and holding section and that is a circuit transmitting a signal which is sampled and quantized,
wherein the sampling and holding section includes a plurality of capacitive elements for accumulating charge generated by an input signal, and a plurality of first switching elements that correspond to the plurality of capacitive elements, respectively, and
wherein a plurality of first clock signals supplied to the plurality of first switching elements are signals having different operation timings, and the first switching elements perform an ON/OFF operation in response to the first clock signals, respectively,
wherein the first switching elements hold the charge respectively accumulated in the plurality of capacitive elements, and
wherein the continuous section includes a plurality of second switching elements for accumulating charge in the plurality of capacitive elements, respectively,
wherein a plurality of second clock signals supplied to the plurality of second switching elements are signals having edges that are triggers for determining operation start times and are different from each other, and edges that are triggers for determining operation end times are identical to each other, and the first clock signals and the second clock signals have a reverse-phased and non-overlapping relationship, and
wherein the second switching elements perform an ON/OFF operation in response to the second clock signals, respectively.

2. An A/D converter comprising:
a sampling circuit including a continuous section for sampling an input analog signal, a sampling and holding section for holding the signal sampled by the continuous section, and a digital section for outputting the signal from the sampling and holding section as a digital signal; and
a clock signal supply unit,
wherein the sampling and holding section includes a plurality of capacitive elements for accumulating charge generated by the analog signal and a plurality of first switching elements for holding and transmitting the charge respectively accumulated in the plurality of capacitive elements to the digital section,
wherein the clock signal supply unit supplies a plurality of first clock signals having different operation timings to the plurality of first switching elements, and
wherein the plurality of first switching elements perform an ON/OFF operation in response to the supplied first clock signals, respectively,
wherein the continuous section includes a plurality of second switching elements that transmit the charge respectively, accumulated in the plurality of capacitive elements,
wherein the clock signal supply unit supplies a plurality of second clock signals having edges that are triggers for determining operation start times are different from each other, and edges that are triggers for determining operation end times are identical to each other, to the plurality of second switching elements,
wherein the plurality of second switching elements perform an ON/OFF operation in response to the second clock signals, respectively, and
wherein the first clock signals and the second clock signals have a reverse-phased and non-overlapping relationship.

3. A D/A converter comprising:
a sampling circuit including a digital section for outputting a digital signal, a sampling and holding section for sampling a reference signal based on the digital signal, and a continuous section for transmitting the signal sampled by the sampling and holding section as an analog signal; and
a clock signal supply unit,
wherein the sampling and holding section includes a plurality of capacitive elements for accumulating charge generated by the reference signal and a plurality of first switching elements for accumulating the charge in the plurality of capacitive elements,
wherein the clock signal supply unit supplies a plurality of first clock signals having different operation timings to the plurality of first switching elements, and
wherein the plurality of first switching elements perform an ON/OFF operation in response to the supplied first clock signals, respectively.

4. The D/A converter according to claim 3, wherein the continuous section includes a plurality of second switching elements for transmitting the charge accumulated in the plurality of capacitive elements,
wherein the clock signal supply unit supplies second clock signals having triggers for determining operation start times generated at the same timing, and triggers for determining operation end times generated at different timings, to the plurality of second switching elements,
wherein the plurality of second switching elements perform an ON/OFF operation in response to the supplied second clock signals, respectively, and
wherein the first clock signals and the second clock signals have a reverse-phased and non-overlapping relationship.

5. A CODEC comprising:
an A/D converter comprising:
a sampling circuit including a continuous section for sampling an input analog signal, a sampling and holding section for holding the signal sampled by the continuous section, and a digital section for outputting the signal from the sampling and holding section as a digital signal; and
a clock signal supply unit,
wherein the sampling and holding section includes a plurality of capacitive elements for accumulating charge generated by the analog signal and a plurality of first switching elements for holding and transmitting the charge respectively accumulated in the plurality of capacitive elements to the digital section,
wherein the clock signal supply unit supplies a plurality of first clock signals having different operation timings to the plurality of first switching elements, and
wherein the plurality of first switching elements perform an ON/OFF operation in response to the supplied first clock signals, respectively; and
a D/A converter comprising:
a sampling circuit including a digital section for outputting a digital signal, a sampling and holding section for sampling a reference signal based on the digital signal, and a continuous section for transmitting the signal sampled by the sampling and holding section as an analog signal; and
a clock signal supply unit,
wherein the sampling and holding section includes a plurality of capacitive elements for accumulating charge generated by the reference signal and a plurality of first switching elements for accumulating the charge in the plurality of capacitive elements,
wherein the clock signal supply unit supplies a plurality of first clock signals having different operation timings to the plurality of first switching elements, and
wherein the plurality of first switching elements perform an ON/OFF operation in response to the supplied first clock signals, respectively.

6. The CODEC according to claim 5, wherein the A/D converter and the D/A converter operate asynchronously.

7. A CODEC comprising:
an A/D converter comprising:
a sampling circuit including a continuous section for sampling an input analog signal, a sampling and holding section for holding the signal sampled by the continuous section, and a digital section for outputting the signal from the sampling and holding section as a digital signal; and
a clock signal supply unit,
wherein the sampling and holding section includes a plurality of capacitive elements for accumulating charge generated by the analog signal and a plurality of first switching elements for holding and transmitting the charge respectively accumulated in the plurality of capacitive elements to the digital section,
wherein the clock signal supply unit supplies a plurality of first clock signals having different operation timings to the plurality of first switching elements, and wherein the plurality of first switching elements perform an ON/OFF operation in response to the supplied first clock signals, respectively, wherein the continuous section includes a plurality of second switching elements that transmit the charge respectively, accumulated in the plurality of capacitive elements, wherein the clock signal supply unit supplies a plurality of second clock signals having edges that are triggers for determining operation start times are different from each other, and edges that are triggers for determining operation end times are identical to each other, to the plurality of second switching elements, wherein the plurality of second switching elements perform an ON/OFF operation in response to the second clock signals, respectively, and wherein the first clock signals and the second clock signals have a reverse-phased and non-overlapping relationship; and a D/A converter comprising:
a sampling circuit including a digital section for outputting a digital signal, a sampling and holding section for sampling a reference signal based on the digital signal, and a continuous section for transmitting the signal sampled by the sampling and holding section as an analog signal; and a clock signal supply unit, wherein the sampling and holding section includes a plurality of capacitive elements for accumulating charge generated by the reference signal and a plurality of first switching elements for accumulating the charge in the plurality of capacitive elements, wherein the clock signal supply unit supplies a plurality of first clock signals having different operation timings to the plurality of first switching elements, and wherein the plurality of first switching elements perform an ON/OFF operation in response to the supplied first clock signals, respectively, wherein the continuous section includes a plurality of second switching elements for transmitting the charge accumulated in the plurality of capacitive elements, wherein the clock signal supply unit supplies second clock signals having triggers for determining operation start times generated at the same timing, and triggers for determining operation end times generated at different timings, to the plurality of second switching elements, wherein the plurality of second switching elements perform an ON/OFF operation in response to the supplied second clock signals, respectively, and wherein the first clock signals and the second clock signals have a reverse-phased and non-overlapping relationship.

8. The CODEC according to claim 7, wherein the A/D converter and the D/A converter operate asynchronously.

9. A sampling circuit comprising:
a continuous section that is a circuit transmitting a continuous signal;
a sampling and holding section that is connected to the continuous section and that is a circuit transmitting a signal which is sampled but not quantized; and
a digital section that is connected to the sampling and holding section and that is a circuit transmitting a signal which is sampled and quantized, wherein the sampling and holding section includes a plurality of capacitive elements for accumulating charge generated by an input signal, and a plurality of first switching elements that correspond to the plurality of capacitive elements, respectively, and wherein a plurality of first clock signals supplied to the plurality of first switching elements are signals having different operation timings, and the first switching elements perform an ON/OFF operation in response to the first clock signals, respectively, wherein the first switching elements accumulate charge in the plurality of capacitive elements, respectively, wherein the continuous section includes a plurality of second switching elements for transmitting the charge respectively accumulated in the plurality of capacitive elements, wherein a plurality of second clock signals supplied to the plurality of second switching elements are signals in which triggers for determining operation start times are generated at the same timing and triggers for determining operation end times are generated at different timings, and the first clock signals and the second clock signals have a reverse-phased and non-overlapping relationship, and wherein the second switching elements perform an ON/OFF operation in response to the second clock signals, respectively.

* * * * *